(12) United States Patent
Sasaki et al.

(10) Patent No.: US 7,352,115 B2
(45) Date of Patent: Apr. 1, 2008

(54) PIEZOELECTRIC ELEMENT AND PIEZOELECTRIC DEVICE

(75) Inventors: Satoshi Sasaki, Akita (JP); Kazushi Tachimoto, Akita (JP)

(73) Assignee: TDK Corporation, Tokyo (JP)

( * ) Notice: Subject to any disclaimer, the term of this patent is extended or adjusted under 35 U.S.C. 154(b) by 366 days.

(21) Appl. No.: 11/099,553

(22) Filed: Apr. 6, 2005

(65) Prior Publication Data

US 2005/0269913 A1 Dec. 8, 2005

(30) Foreign Application Priority Data

Apr. 28, 2004 (JP) .......................... P2004-134044
Dec. 13, 2004 (JP) .......................... P2004-360360
Feb. 24, 2005 (JP) .......................... P2005-049346

(51) Int. Cl.
*H01L 41/04* (2006.01)

(52) U.S. Cl. ................ 310/365; 314/364; 314/366; 314/363

(58) Field of Classification Search ......... 310/363–366
See application file for complete search history.

(56) References Cited

U.S. PATENT DOCUMENTS

| | | | | |
|---|---|---|---|---|
| 6,121,718 | A * | 9/2000 | Mohr, III | ............... 310/334 |
| 6,462,464 | B2 * | 10/2002 | Mitarai et al. | ............... 310/366 |
| 6,998,764 | B2 * | 2/2006 | Sasaki et al. | ............... 310/365 |
| 7,170,217 | B2 * | 1/2007 | Sasaki | ............... 310/366 |
| 7,233,099 | B2 * | 6/2007 | Sasaki | ............... 310/365 |
| 7,253,553 | B2 * | 8/2007 | Sasaki | ............... 310/365 |
| 2004/0174094 | A1 * | 9/2004 | Sasaki et al. | ............... 310/328 |
| 2005/0001519 | A1 * | 1/2005 | Sasaki et al. | ............... 310/365 |
| 2005/0140251 | A1 * | 6/2005 | Sasaki | ............... 310/366 |

FOREIGN PATENT DOCUMENTS

| | | |
|---|---|---|
| JP | A-07-106652 | 4/1995 |
| JP | A-09-023030 | 1/1997 |
| JP | A-2000-133851 | 5/2000 |
| JP | A-2000-152670 | 5/2000 |
| JP | A 2000-261055 | 9/2000 |
| JP | A 2001-260349 | 9/2001 |

* cited by examiner

*Primary Examiner*—J. San Martin
(74) *Attorney, Agent, or Firm*—Oliff & Berridge, PLC

(57) ABSTRACT

A piezoelectric element is provided with a multilayer body comprising an alternate stack of first internal electrodes and second internal electrodes with a piezoelectric layer in between each two of the first and second internal electrodes. The multilayer body has an outermost piezoelectric layer adjoining the second internal electrode at an extreme end in a stack direction of the multilayer body among the first internal electrodes and the second internal electrodes and constituting one end face in the stack direction of the multilayer body. The whole first internal electrode adjacent in the stack direction of the multilayer body to the second internal electrode adjoining the outermost piezoelectric layer is hidden by the second internal electrode adjoining the outermost piezoelectric layer, when viewed in the stack direction of the multilayer body from the outermost piezoelectric layer side.

3 Claims, 23 Drawing Sheets

PIEZOELECTRIC ELEMENT AND PIEZOELECTRIC DEVICE

BACKGROUND OF THE INVENTION

1. Field of the Invention

The present invention relates to a piezoelectric element and a piezoelectric device.

2. Related Background Art

An example of the known piezoelectric elements of this kind is the one disclosed in Japanese Patent Application Laid-Open No. 2000-261055. The piezoelectric element disclosed in Laid-Open No. 2000-261055 is provided with a multilayer body comprising an alternate stack of first internal electrodes and second internal electrodes with a piezoelectric layer in between each two of the first and second internal electrodes.

SUMMARY OF THE INVENTION

However, the foregoing conventional piezoelectric element had the following problem. Namely, where, in order to transfer displacement of the piezoelectric element to a liquid, an end face of the multilayer body, particularly, one end face in the stack direction is used as a working surface to be brought into direct contact with the liquid, the liquid penetrates the working surface (the one end face in the stack direction of the multilayer body) into the multilayer body during use of the element, so as to cause insulation deterioration of the element.

An object of the present invention is to provide a piezoelectric element and a piezoelectric device capable of suppressing the insulation deterioration, even in cases of transferring displacement to the liquid.

The Inventors conducted research and study and found that the phenomenon of penetration of the liquid into the multilayer body occurred according to the following scenario.

In the piezoelectric element disclosed in Laid-Open No. 2000-261055, the multilayer body has the outermost piezoelectric layer adjoining the second internal electrode at an extreme end in the stack direction of the multilayer body among the first internal electrodes and the second internal electrodes and constituting the working surface. The first internal electrode adjacent to the second internal electrode adjoining the outermost piezoelectric layer, when viewed in the stack direction of the multilayer body from the outermost piezoelectric layer side, comprises two portions: a first portion over and behind the second internal electrode adjoining the outermost piezoelectric layer, and a second portion unhidden without overlap with the second internal electrode.

When an electric field is created between the first internal electrode and the second internal electrode, a region in the working surface corresponding to the second internal electrode comes to have the same charge as the second internal electrode, while a region in the working surface corresponding to the second portion of the first internal electrode comes to have the same charge as the first internal electrode, i.e., the charge opposite to that on the second internal electrode. For this reason, the liquid located near the region in the working surface corresponding to the second internal electrode becomes charged with the same charge as the second internal electrode. The liquid located near the region in the working surface corresponding to the second portion of the first internal electrode becomes charged with the charge opposite to that on the second internal electrode. The liquid charged with the charge opposite to that on the second internal electrode is attracted by the electric field between the first internal electrode and the second internal electrode to penetrate into the multilayer body. At this time, where the piezoelectric layers (including the outermost piezoelectric layer) are made of a ceramic, the liquid charged with the charge opposite to that on the second internal electrode is considered to penetrate through grain boundaries of the outermost piezoelectric layer into the multilayer body by virtue of electro-osmosis.

In addition to the above-stated scenario, another conceivable reason why the liquid stored in the liquid chamber is charged with the charge opposite to that on the second internal electrode is influence of electric fields caused by various components, devices, etc. disposed around the piezoelectric device.

An aspect of the present invention is a piezoelectric element comprising: a multilayer body comprising an alternate stack of first internal electrodes and second internal electrodes with a piezoelectric layer in between each two of the first and second internal electrodes, wherein the multilayer body has an outermost piezoelectric layer adjoining the second internal electrode at an extreme end in a stack direction of the multilayer body among the first internal electrodes and the second internal electrodes and constituting one end face in the stack direction of the multilayer body, and wherein the whole first internal electrode adjacent in the stack direction of the multilayer body to the second internal electrode adjoining the outermost piezoelectric layer is hidden by the second internal electrode adjoining the outermost piezoelectric layer, when viewed in the stack direction of the multilayer body from the outermost piezoelectric layer side.

In the present invention, the whole first internal electrode adjacent in the stack direction of the multilayer body to the second internal electrode adjoining the outermost piezoelectric layer is hidden by the second internal electrode adjoining the outermost piezoelectric layer, when viewed in the stack direction of the multilayer body from the outermost piezoelectric layer side; therefore, the one end face constituted by the outermost piezoelectric layer will not become charged with the same charge as the first internal electrode, i.e., with the charge opposite to that on the second internal electrode. For this reason, even in a case where the one end face of the multilayer body is used as a working surface to be brought into direct contact with a liquid, when an electric field is created between the first internal electrode and the second internal electrode, the liquid located near the one end face becomes charged with the same charge as the second internal electrode, but is not charged with the charge opposite to that on the second internal electrode. Therefore, the liquid located near the one end face is not attracted by the electric field between the first internal electrode and the second internal electrode and is thus prevented from penetrating into the multilayer body. As a result, it is feasible to suppress the insulation deterioration.

Preferably, an entire surface of the outermost piezoelectric layer adjoining the second internal electrode is covered by the mentioned second internal electrode. In this case, the whole first internal electrode adjacent to the second internal electrode adjoining the outermost piezoelectric layer can be securely hidden by the second internal electrode adjoining the outermost piezoelectric layer, when viewed in the stack direction of the multilayer body from the outermost piezoelectric layer side.

Preferably, each first internal electrode is comprised of a plurality of individual electrodes arrayed in a matrix pattern. In this case, a voltage can be independently applied to each individual electrode, and thus there are a plurality of portions to be displaced, in one element.

Another aspect of the present invention is a piezoelectric element comprising: a multilayer body comprising an alternate stack of first internal electrodes and second internal electrodes with a piezoelectric layer in between each two of the first and second internal electrodes, wherein the multilayer body has an outermost piezoelectric layer adjoining the second internal electrode at an extreme end in a stack direction of the multilayer body among the first internal electrodes and the second internal electrodes and constituting one end face in the stack direction of the multilayer body, and wherein when an electric field is created between the first internal electrodes and the second internal electrodes, no charge opposite to that on the second internal electrode adjoining the outermost piezoelectric layer is generated on the one end face in the stack direction of the multilayer body.

In the present invention, when the electric field is created between the first internal electrodes and the second internal electrodes, the one end face in the stack direction of the multilayer body is not charged with the charge opposite to that on the second internal electrode adjoining the outermost piezoelectric layer, therefore, even in the case where the one end face is used as a working surface to be brought into direct contact with a liquid, the liquid located near the one end face is not charged with the charge opposite to that on the second internal electrode. Therefore, the liquid located near the one end face is not attracted by the electric field generated between the first internal electrode and the second internal electrode, so as to be prevented from penetrating into the multilayer body. As a result, it is feasible to suppress the insulation deterioration.

Another aspect of the present invention is a piezoelectric element comprising: a multilayer body comprising an alternate stack of first internal electrodes and second internal electrodes with a piezoelectric layer in between each two of the first and second internal electrodes, wherein the multilayer body has a shield electrode located so as to adjoin the second internal electrode located at an extreme end in a stack direction of the multilayer body among the first internal electrodes and the second internal electrodes and located outside said second internal electrode in the stack direction of the multilayer body, wherein the shield electrode is electrically connected to the second internal electrode located at the extreme end in the stack direction of the multilayer body, and wherein the whole first internal electrode adjacent in the stack direction of the multilayer body to the second internal electrode located at the extreme end in the stack direction of the multilayer body is hidden by each of the second internal electrode located at the extreme end in the stack direction of the multilayer body, and the shield electrode, when viewed in the stack direction of the multilayer body from the shield electrode side.

In the present invention, when viewed in the stack direction of the multilayer body from the shield electrode side, the whole first internal electrode adjacent in the stack direction of the multilayer body to the second internal electrode located at the extreme end in the stack direction of the multilayer body is hidden by each of the second internal electrode located at the extreme end in the stack direction of the multilayer body, and the shield electrode; therefore, the end face of the multilayer body on the shield electrode side is not charged with the same charge as the first internal electrode, i.e., with the charge opposite to that on the second internal electrode. For this reason, even in the case where the end face of the multilayer body is used as a working surface to be brought into direct contact with a liquid, when the electric field is generated between the first internal electrode and the second internal electrode, the liquid located near the end face becomes charged with the same charge as the second internal electrode, but is not charged with the charge opposite to that on the second internal electrode. Accordingly, the liquid located near the end face is not attracted by the electric field between the first internal electrode and the second internal electrode, so as to be prevented from penetrating into the multilayer body.

In the present invention, the shield electrode is electrically connected to the second internal electrode located at the extreme end in the stack direction of the multilayer body; therefore, an equipotential region is created between the shield electrode and the second internal electrode located at the extreme end in the stack direction of the multilayer body. Therefore, even if the liquid in Sect contact with the foregoing end face of the multilayer body is charged with the charge opposite to that on the second internal electrode because of influence from electric fields caused by various components, devices, etc. disposed around the piezoelectric device, the liquid is prevented from penetrating the foregoing equipotential region into the multilayer body.

As seen from the above, the present invention successfully suppresses the insulation deterioration of the piezoelectric element.

Preferably, the entire piezoelectric layer adjoining the second internal electrode located at the extreme end in the stack direction of the multilayer body is covered by the second internal electrode located at the extreme end in the stack direction of the multilayer body, and the entire piezoelectric layer adjoining the shield electrode is covered by the shield electrode. In this case, the whole first material electrode adjacent in the stack direction of the multilayer body to the second internal electrode located at the extreme end in the stack direction of the multilayer body can be securely hidden by the second internal electrode located at the extreme end in the stack direction of the multilayer body, when viewed in the stack direction of the multilayer body from the shield electrode side. In addition, the whole first internal electrode adjacent in the stack direction of the multilayer body to the second internal electro located at the extreme end in the stack direction of the multilayer body can be securely hidden by the shield electrode, when viewed in the stack direction of the multilayer body from the shield electrode side.

Preferably, the multilayer body has an outermost piezoelectric layer adjoining the shield electrode and constituting one end face in the stack direction of the multilayer body. In this case, the outermost piezoelectric layer serves as a working surface in contact with a liquid, and, therefore, the shield electrode is not in direct contact with the liquid. For this reason, the outermost piezoelectric layer also functions as a protecting layer to protect the shield electrode from the liquid. In addition, since the outermost piezoelectric layer is comprised of the same piezoelectric material as the other piezoelectric layers, it does not inhibit the performance of the piezoelectric element.

Still another aspect of the present invention is a piezoelectric device comprising: a multilayer body comprising an alternate stack of first internal electrodes and second internal electrodes with a piezoelectric layer in between each two of the first and second internal electrodes; and a liquid chamber which is arranged adjacent to one end face of the multilayer body and a part of which is defined by the one end face of the multilayer body, wherein the multilayer body has a shield electrode located so as to adjoin the second material electrode at a position closest to the one end face of the multilayer body among the first internal electrodes and the second internal electrodes, and located outside the mentioned second internal electrode in the stack direction of the multilayer body, wherein the shield electrode is electrically connected to the second internal electrode at the position closest to the one end face of the multilayer body, and wherein the whole liquid chamber is hidden by each of the second internal electrode at the position closest to the one end face of the multilayer body, and the shield electrode, when viewed in the stack direction of the multilayer body from the multilayer body side.

In the present invention, the whole liquid chamber is hidden by each of the second internal electrode at the position closest to the one end face of the multilayer body and the shield electrode, when viewed in the stack direction of the multilayer body from the multilayer body side; the one end face of the multilayer body is not charged with the same charge as the first internal electrode, i.e., with the charge opposite to that on the second internal electrode. For this reason, even in the case where the one end face of the multilayer body is used as a working surface to be brought into direct contact with a liquid, when an electric field is generated between the first internal electrode and the second internal electrode, the liquid located near the one end face becomes charged with the same charge as the second internal electrode, but is not charged with the charge opposite to that on the second internal electrode. Accordingly, the liquid located near the one end face is not attracted by the electric field between the first internal electrode and the second internal electrode, so as to be prevented from penetrating into the multilayer body.

In the present invention, the shield electrode is electrically connected to the second material electrode at the position closest to the one end face of the multilayer body; therefore, an equipotential region is created between the shield electrode and the second internal electrode at the position closest to the one end face of the multilayer body. Therefore, even if the liquid in direct contact with the one end face of the multilayer body is charged with the charge opposite to that on the second internal electrode because of influence from electric fields caused by various components, devices, etc. disposed around the piezoelectric device, it is prevented from penetrating the foregoing equipotential region into the multilayer body.

As seen from the above, the present invention successfully suppresses the insulation deterioration of the piezoelectric device.

Preferably, the entire piezoelectric layer adjoining the second internal electrode at the position closest to the one end face of the multilayer body is covered by the second internal electrode at the position closest to the one end face of the multilayer body, and the entire piezoelectric layer adjoining the shield electrode is covered by the shield electrode. In this case, the whole liquid chamber can be securely hidden by the second internal electrode at the position closest to the one end face of the multilayer body, when viewed in the stack diction of the multilayer body from the multilayer body side. In addition, the whole liquid chamber can be securely hidden by the shield electrode when viewed in the stack direction of the multilayer body from the multilayer body side.

Preferably, the multilayer body has an outermost piezoelectric layer adjoining the shield electrode and constituting one end face in the stack direction of the multilayer body. In this case, the outermost piezoelectric layer serves as a working surface to be kept in contact with a liquid, and the shield electrode is not in direct contact with the liquid. For this reason, the outermost piezoelectric layer also functions as a protecting layer to protect the shield electrode from the liquid. In addition, since the outermost piezoelectric layer is made of the same piezoelectric material as the other piezoelectric layers, it does not inhibit the performance of the piezoelectric device.

Preferably, each first internal electrode is comprised of a plurality of individual electrodes arrayed in a matrix pattern. In this case, a voltage can be independently applied to each individual electrode, and, therefore, there are a plurality of portions to be displaced, in one element.

Another piezoelectric element according to the present invention is a piezoelectric element comprising: a piezoelectric layer; an individual electrode and a common electrode arranged opposite each other with the piezoelectric layer in between, and intended for displacing the piezoelectric layer; and a displacement transfer layer laid through the individual electrode or through the common electrode on the piezoelectric layer, and arranged to transfer displacement of the piezoelectric layer to a liquid, wherein a film with electric conductivity is formed on an end face of the displacement transfer layer opposite the piezoelectric layer.

Where the piezoelectric element described above is used for control of a liquid, for example, a liquid flow portion with a liquid chamber for accommodating the liquid is located on the opposite side to the piezoelectric layer with respect to the displacement transfer layer, and the liquid chamber of the liquid flow portion is filled with the liquid. When in that state a voltage is applied between the individual electrode and the common electrode, an electric field is generated in a portion (piezoelectric active part) between the individual electrode and common electrode in the piezoelectric layer, whereupon the piezoelectric active part expands and contracts (to be displaced), and the displacement is transferred through the displacement transfer layer to the liquid. At this time, the same voltage as that on the common electrode (ground potential) is applied to the film with electric conductivity formed on the end face of the displacement transfer layer opposite the piezoelectric layer, so as to apply a negative electric field to the liquid in contact with the film with electric conductivity. In this case, the liquid is not positively charged, which prevents occurrence of the electroosmosis phenomenon in which the charged liquid is attracted toward the common electrode to penetrate into the piezoelectric element. For this reason, it is feasible to suppress the insulation failure of the piezoelectric element or the like.

Preferably, the film with electric conductivity is electrically connected to the common electrode. In this case, the same voltage as that on the common electrode can be applied to the film with electric conductivity, without need for attaching a lead wire or the like to the film with electric conductivity.

Preferably, the displacement transfer layer is made of the same material as the piezoelectric layer. In this case, the displacement transfer layer can be formed in the same manner as the piezoelectric layer, without need for separately preparing the material for the displacement transfer layer in addition to the material for the piezoelectric layer. This facilitates the production of the piezoelectric element.

A piezoelectric device according to the present invention is a piezoelectric device comprising: a piezoelectric layer; an individual electrode and a common electrode arranged opposite each other with the piezoelectric layer in between, and intended for displacing the piezoelectric layer; a displacement transfer layer laid through the individual electrode or through the common electrode on the piezoelectric layer, and arranged to transfer displacement of the piezoelectric layer to a liquid; and a liquid flow portion located on a side of the displacement transfer layer opposite the piezoelectric layer, and having a liquid chamber for accommodating the liquid, wherein a film with electric conductivity is formed on at least a portion corresponding to the liquid chamber, in an end face of the displacement transfer layer on the liquid flow portion side.

When in this piezoelectric device a voltage is applied between the individual electrode and the common electrode in a state in which the liquid chamber of the liquid flow portion is filled with the liquid, an electric field is generated in a portion between the individual electrode and the common electrode in the piezoelectric layer (piezoelectric active part), whereupon the piezoelectric active part expands and contracts (to be displaced), and the displacement is transferred through the displacement transfer layer to the liquid. At this time, the same voltage as that on the common electrode (ground potential) is applied to the film with electric conductivity formed on the end face of the displacement transfer layer on the liquid flow portion side, so as to apply a negative electric field to the liquid in contact with the film with electric conductivity. In this case, the liquid is not positively charged, which prevents occurrence of the electroosmosis phenomenon in which the charged liquid is attracted toward the common electrode to penetrate into the piezoelectric layer. This suppresses the insulation failure of the piezoelectric device or the like.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. The same elements, or elements with the same function will be denoted by the same reference symbols in the description, without redundant description. The terms "upper" and "lower" are used in the description, and they correspond to the vertical relation in each drawing.

First Embodiment

Figure 1:
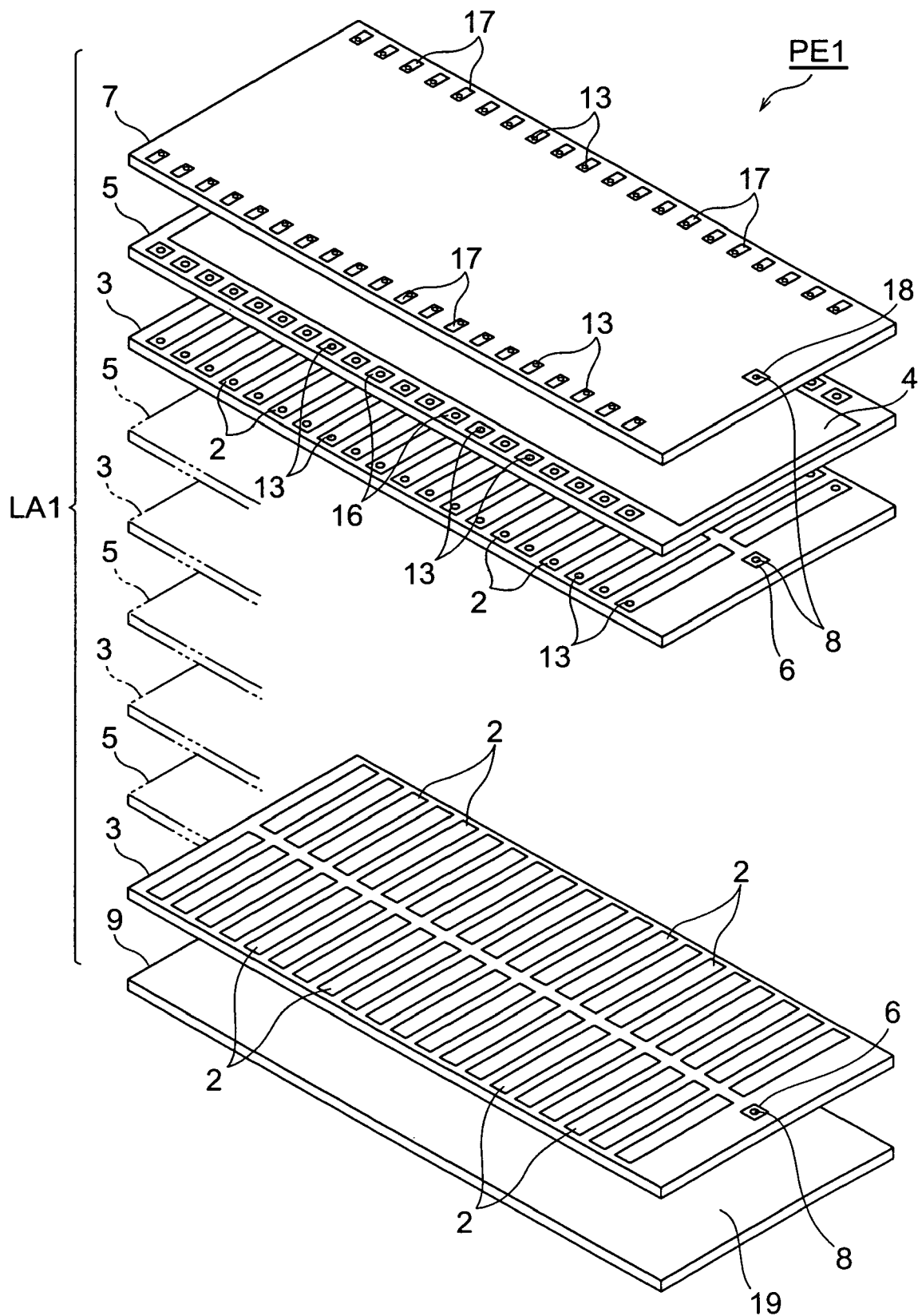
FIG. 1 is an exploded perspective view illustrating a multilayer piezoelectric element according to a first embodiment.
Figure 2:
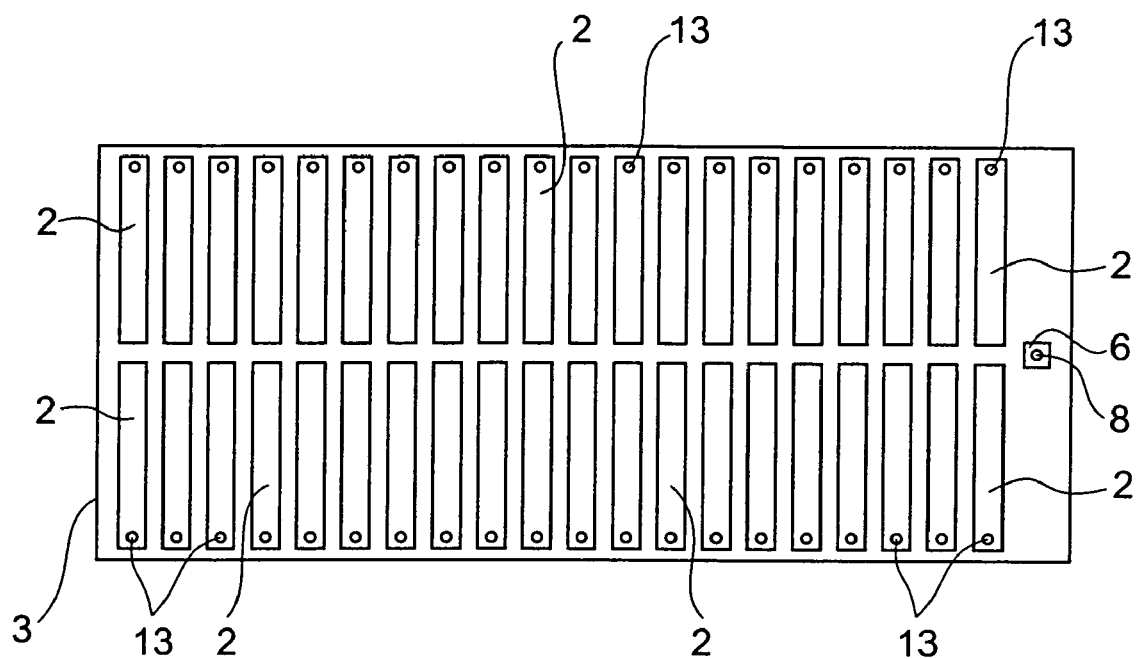
FIG. 2 is a schematic view illustrating a piezoelectric layer with individual electrodes formed thereon, in the multilayer piezoelectric element illustrated in FIG. 1.
Figure 3:
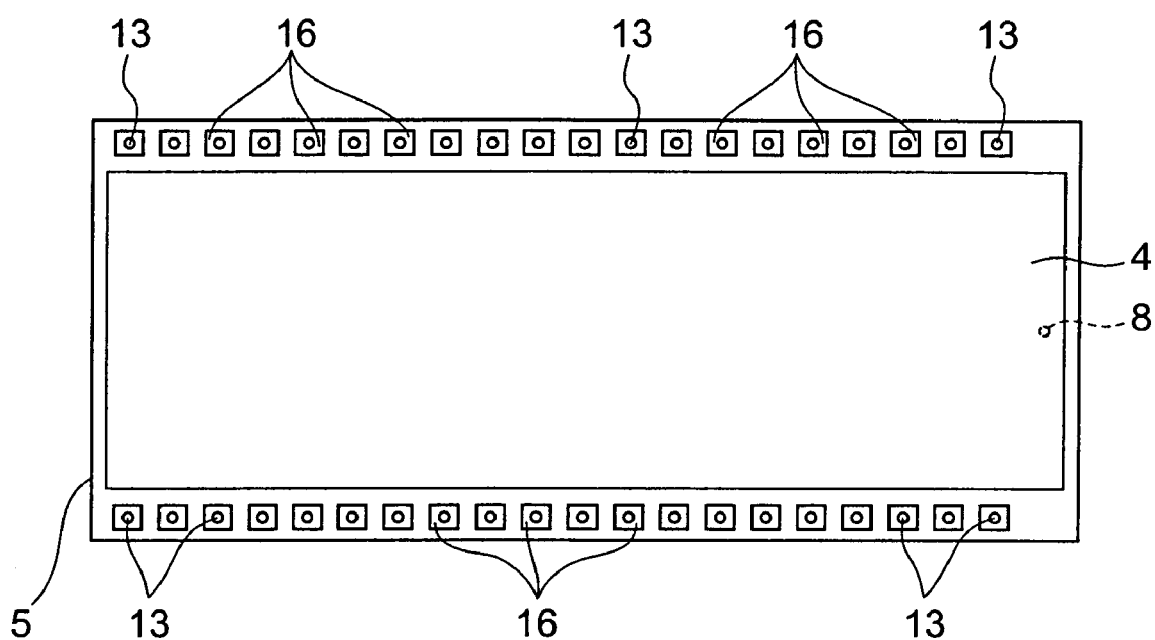
FIG. 3 is a schematic diagram illustrating a piezoelectric layer with a common electrode formed thereon, in the multilayer piezoelectric element illustrated in FIG. 1.
Figure 4:
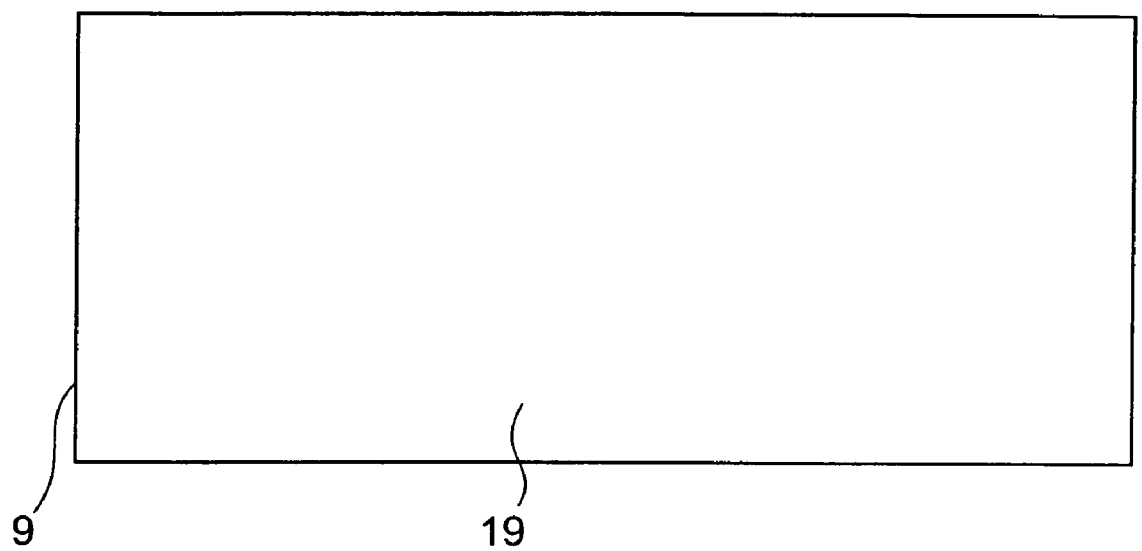
FIG. 4 is a schematic diagram illustrating a piezoelectric layer with a common electrode formed thereon, in the multilayer piezoelectric element illustrated m FIG. 1.
Figure 5:
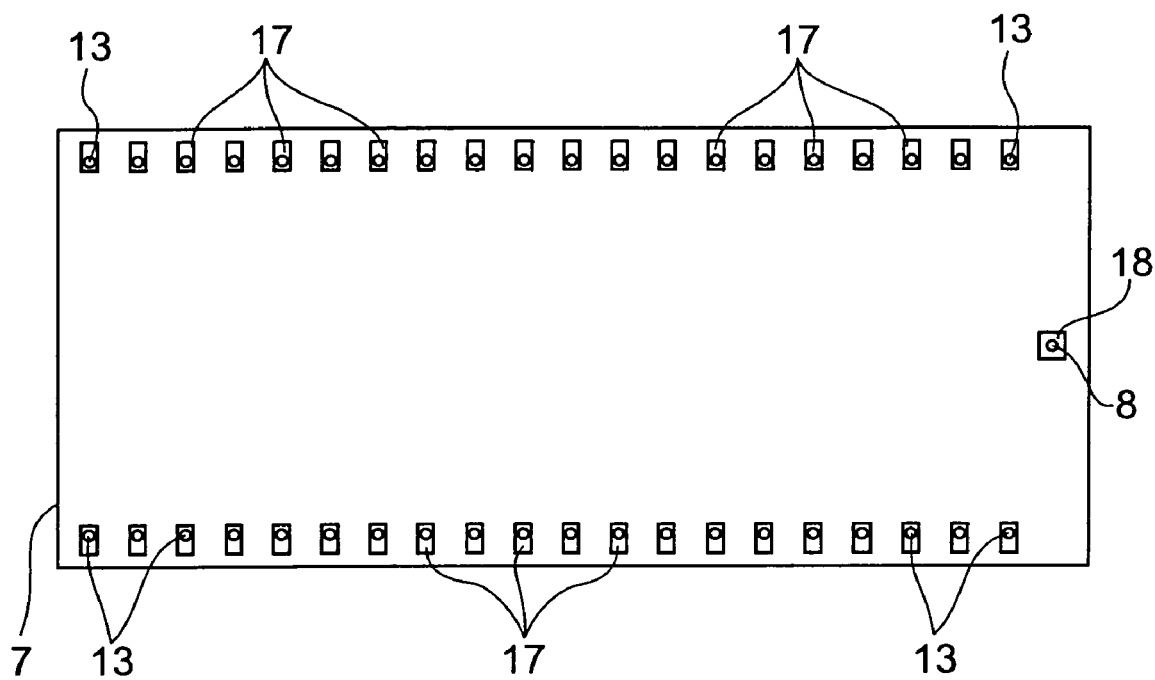
FIG. 5 is a schematic diagram illustrating a piezoelectric layer with external electrodes formed thereon, in the multilayer piezoelectric element illustrated in FIG. 1.
Figure 6:
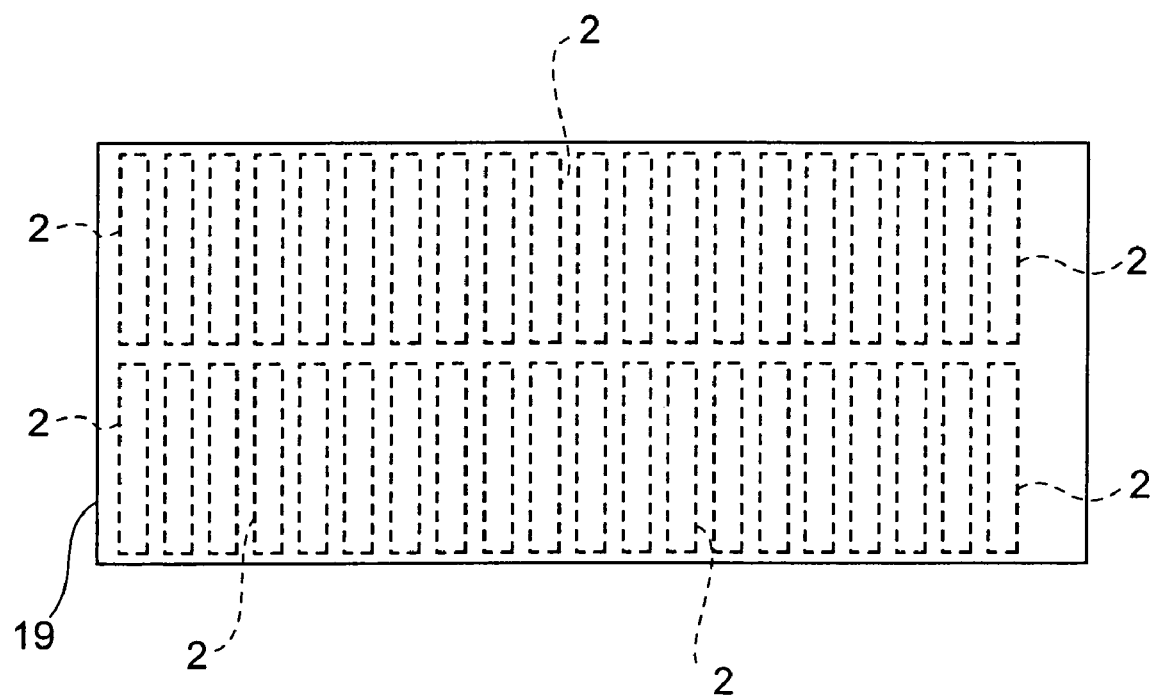
FIG. 6 is a schematic diagram illustrating individual electrodes and a common electrode in the multilayer piezoelectric element illustrated in FIG. 1.
Figure 7:
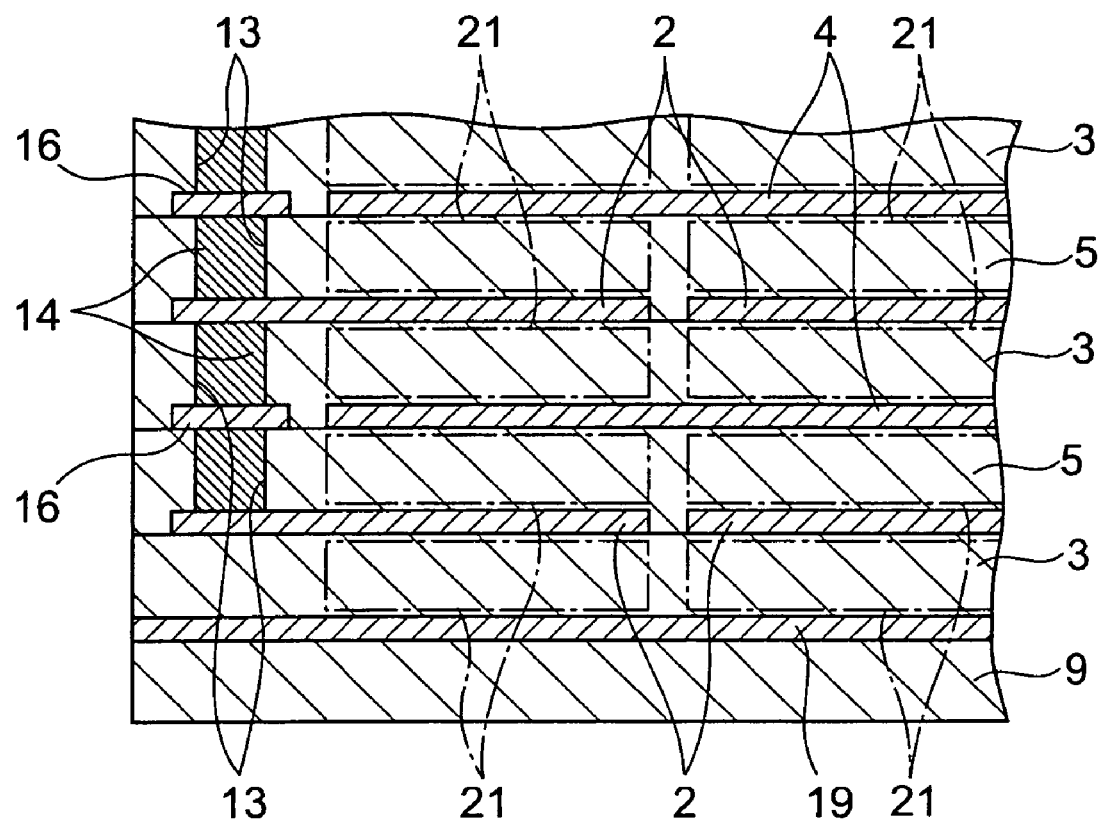
FIG. 7 is a schematic diagram illustrating a sectional configuration of the multilayer piezoelectric element according to the first embodiment.

First, a configuration of a multilayer piezoelectric element according to the first embodiment will be described on the basis of FIGS. 1 to 7. FIG. 1 is an exploded perspective view illustrating the multilayer piezoelectric element of the present embodiment. FIG. 2 is a schematic diagram illustrating a piezoelectric layer with individual electrodes formed thereon, in the multilayer piezoelectric element illustrated in FIG. 1. FIGS. 3 and 4 are schematic diagrams illustrating piezoelectric layers with a common electrode formed thereon, in the multilayer piezoelectric element illustrated in FIG. 1. FIG. 5 is a schematic diagram illustrating a piezoelectric layer with external electrodes formed thereon, in the multilayer piezoelectric element illustrated in FIG. 1. FIG. 6 is a schematic diagram illustrating individual electrodes and a common electrode in the multilayer piezoelectric element illustrated in FIG. 1. FIG. 7 is a schematic diagram illustrating a sectional configuration of the multilayer piezoelectric element of the first embodiment.

The multilayer piezoelectric element PE1 is provided with a multilayer body LA1 of rectangular parallelepiped shape. The multilayer body LA1, as shown in FIG. 1, is constructed of an alternate stack of piezoelectric layers 3 and piezoelectric layers 5 four each, and a piezoelectric layer 7 and a piezoelectric layer 9 (outermost piezoelectric layer) arranged to interpose the piezoelectric layers 3 and 5 in between from top and bottom. Individual electrodes 2 (first internal electrode) are formed on each of the piezoelectric layers 3. A common electrode 4 (second internal electrode) is formed on each of the piezoelectric layers 5. External electrodes 17, 18 are formed on the piezoelectric layer 7. A common electrode 19 (second internal electrode) is formed on the piezoelectric layer 9. The piezoelectric layer 9 constitutes one end face in a stack direction of the multilayer body LA1 (in the first embodiment the "stack direction of the multilayer body LA1" will be referred to hereinafter simply as "stack direction"). The piezoelectric layer 7 constitutes the other end face in the stack direction.

Each piezoelectric layer 3, 5, 7, or 9 is made, for example, of a piezoelectric ceramic material comprising lead zirconate titanate (PZT) as the main component and having the powder density of 8000 kg/m$^3$, and is formed in a rectangular thin plate shape of "10 mm×30 mm, and 30 µm thick." The individual electrodes 2, common electrodes 4, 19, and external electrodes 17, 18 are made of a material comprising silver and palladium as the main component and are formed in a pattern by screen printing. This also applies to each of the electrodes described below A plurality of individual electrodes 2 are arranged in a matrix pattern, as shown in FIG. 2, on the upper surface of each of the third, fifth, seventh, and ninth piezoelectric layers 3 as counted from the piezoelectric layer 7 of the uppermost layer. The individual electrodes 2 are arranged with a predetermined space from each other, so as to achieve electrical independence and prevent influence from each other's vibration. Under such definitions that the longitudinal direction of the piezoelectric layers 3 is a row direction and the direction perpendicular to the longitudinal direction is a column direction, the individual electrodes 2 are arranged, for example, in a matrix of two rows and seventy five columns (the drawing shows a matrix of two rows and twenty columns for clarity).

As a plurality of individual electrodes 2 are arranged in the matrix pattern in this manner, a plurality of individual electrodes 2 can be efficiently arranged on the piezoelectric layers 3. In consequence, it is feasible to achieve size reduction of the multilayer piezoelectric element PE1 or high integration of individual electrodes 2, while maintaining the area of active parts contributing to vibration in the piezoelectric layers 3. An active part herein is a portion that becomes distorted in each piezoelectric layer by piezoelectric effect.

The aforementioned individual electrodes 2 are formed in a rectangular shape and are arranged so that the longitudinal direction thereof is perpendicular to the longitudinal direction of the piezoelectric layers 3. Each individual electrode 2 is connected to an electroconductive member in a through hole 13 formed in the piezoelectric layer 3 and immediately below an outside end thereof (except for the lowermost (ninth) piezoelectric layer 3).

An intermediate electrode 6 for electrically connecting the common electrodes 4, 19 on the piezoelectric layers 5 located above and below is formed in a longitudinal edge part on the upper surface of each piezoelectric layer 3. This intermediate electrode 6 is connected to an electroconductive member in a through hole 8 formed immediately below the intermediate electrode in the piezoelectric layer 3.

A common electrode 4 of rectangular shape is formed, as shown in FIG. 3, on the upper surface of each of the second, fourth, sixth, and eighth piezoelectric layers 5 as counted from the piezoelectric layer 7 of the uppermost layer. The common electrode 4 is solidly formed over the surface so as to overlap the portion except for the outside ends of the respective individual electrodes 2 on the piezoelectric layers 3, when viewed from the thickness direction of the piezoelectric layers 3, 5, i.e., from the stack direction. The common electrode 4 is connected to an electroconductive member in a through hole 8 formed in the piezoelectric layer 5 so as to face the intermediate electrode 6 on the piezoelectric layer 3 in the stack direction.

Intermediate electrodes 16 are formed on the upper surface of each piezoelectric layer 5 so as to face the outside ends of the respective individual electrodes 2 on the piezoelectric layer 3 in the stack direction. Each intermediate electrode 16 is connected to an electroconductive member in a through hole 13 formed immediately below it in the piezoelectric layer 5.

A common electrode 19 of rectangular shape is formed, as shown in FIG. 4, on the upper surface of the tenth (lowermost) piezoelectric layer 9 as counted from the piezoelectric layer 7 of the uppermost layer. In this configuration, the common electrode 19 is located at the extreme end in the stack direction among the electrodes 2, 4, 19, and is adjacent to the piezoelectric layer 9. The common electrode 19 is connected to an electroconductive member in a through hole 8 formed in the piezoelectric layer 5 so as to face the intermediate electrode 6 on the piezoelectric layer 3 in the stack direction, as the common electrode 4 is.

The common electrode 19 is formed in the same shape as the piezoelectric layer 9 when viewed from the stack direction. Namely, the common electrode 19 is solidly formed over the piezoelectric layer 9 so that the common electrode 19 covers the whole surface in the piezoelectric layer 9 (the surface on which the common electrode 19 is formed) adjacent to the common electrode 19. This results in placing all of the individual electrodes 2 adjacent in the stack direction to the common electrode 19, behind the common electrode 19, as shown in FIG. 6, when viewed in the stack direction from the piezoelectric layer 9 side.

External electrodes 17 are formed on the upper surface of the uppermost piezoelectric layer 7 so as to face the respective intermediate electrodes 16 on the piezoelectric layer 5 in the stack direction, as shown in FIG. 5. In addition, an external electrode 18 is formed on the upper surface of the piezoelectric layer 7 so as to face the intermediate electrode 6 on the piezoelectric layer 3 in the stack direction. Each external electrode 17 is connected to an electroconductive member in a through hole 13 formed immediately below it in the piezoelectric layer 7. The external electrode 18 is connected to an electroconductive member in a through hole 8 formed immediately below it in the piezoelectric layer 7.

Each external electrode 17, 18 on the uppermost layer is provided with a silver printed electrode to which a lead wire for electrically connecting the external electrode to a drive power source is to be attached, and functions as a terminal electrode of the multilayer piezoelectric element PE1.

As the piezoelectric layers 3, 5, 7, and 9 with the electrode patterns as described above are stacked, four individual electrodes 2 are aligned with an intermediate electrode 16 in between each two of them in the thickness direction, with respect to each external electrode 17 on the uppermost layer. The electrodes 2, 16, and 17 thus aligned are electrically connected by the electroconductive members in the through holes 13. More specifically, as shown in FIG. 7, individual electrodes 2, 2 adjacent to each other in the thickness direction are electrically connected by the electroconductive members 14 in the through holes 13 with the intermediate electrode 16 in between.

On the other hand, four common electrodes 4 and the common electrode 19 on the lowermost layer are aligned with an intermediate electrode 6 in between each two of them in the stack direction, with respect to the external electrode 18 on the uppermost layer. The electrodes 4, 6, 18, and 19 thus aligned are electrically connected by the electroconductive members 14 in the through holes 8.

In the electric connection in the multilayer piezoelectric element PE1 as described above, when a voltage is applied between a predetermined external electrode 17 and the external electrode 18, the voltage is applied between the individual electrodes 2 aligned under the predetermined external electrode 17, and the common electrodes 4, 19. For example, let us suppose that the external electrode 17 is kept at a positive potential and the external electrode 18 at a negative potential. This results in generating an electric field in portions interposed between the portions except for the outside ends of the individual electrodes 2 and the common electrodes 4, 19, as shown in FIG. 7, in the piezoelectric layers 3, 5 and, in turn, displacing the interposed portions as active parts 21. By selecting an external electrode 17 to which the voltage is applied, therefore, the active parts 21 aligned under the selected external electrode 17 can be displaced in the thickness direction, out of the active parts 21 corresponding to the individual electrodes 2 arranged in the matrix pattern. When the electric field is generated between the common electrodes 4, 19 and the portions except for the outside ends of the individual electrodes 2, the whole of the individual electrodes 2 adjacent in the stack direction to the common electrode 19 are hidden by the common electrode 19 when viewed in the stack direction from the piezoelectric layer 9 side; therefore, the same charge as that on the individual electrodes 2, i.e., the charge opposite to that on the common electrode 19 is not generated on the lower surface of the piezoelectric layer 9 (one end face of the multilayer body LA1).

Next, a production procedure of the above-described multilayer piezoelectric element PE1 will be described. First, an organic binder, an organic solvent, etc. are mixed into a piezoelectric material comprising a ceramic such as lead zirconate titanate as the main component, to prepare a substrate paste. Then source sheets (green sheets) for the respective piezoelectric layers 3, 5, 7, 9 are formed using the prepared substrate paste. An organic binder, an organic solvent, etc. are mixed into a metal material comprising silver (Ag) and palladium (Pd) at a predetermined ratio (e.g., Ag:Pd=7:3), to prepare an electroconductive paste for formation of electrode patterns.

Subsequently, the predetermined locations on the source sheets for the respective piezoelectric layers 3, 5, 7, 9 are exposed to laser light to form the through holes 8, 13. The laser used at this time is a third harmonic laser of YAG The diameter of the through holes 8, 13 is 40-50 μm. Then the electroconductive members are formed in the through holes 8, 13. The electroconductive members are formed by filling screen printing with the aforementioned electroconductive paste.

Next, an electrode pattern corresponding to the individual electrodes 2 is formed on each of the source sheets for the piezoelectric layers 3. An electrode pattern corresponding to the common electrode 4 and intermediate electrodes 16 is formed on each of the source sheets for the piezoelectric layers 5. An electrode pattern corresponding to the common electrode 19 is formed on the source sheet for the piezoelectric layer 9. An electrode pattern corresponding to the external electrodes 17, 18 is formed on the source sheet for the piezoelectric layer 7. Each of the electrode patterns is formed by screen printing with the aforementioned electroconductive paste.

Next, the source sheets with the respective electrode patterns thereon are stacked in the aforementioned order. Thereafter, the ten source sheets stacked are pressed in the stack direction under the pressure of 100 MPa with heat at 60° C., thereby preparing a green laminate. The green laminate thus prepared is cut into a predetermined size. The cut green laminate is degreased at about 400° C. Thereafter, the green laminate is baked at about 1100° C. in a hermetically closed sagger for two hours to obtain a sintered body in the size of 10 mm×30 mm.

Next, silver printed electrodes are provided on the external electrodes 17, 18 on the sintered sheet for the piezoelectric layer 7, thereby forming the terminal electrodes for lead connection. Thereafter, a polarization process is carried out at the temperature of 120° C. for three minutes so as to achieve the field intensity of 3 kV/mm, thereby obtaining the multilayer piezoelectric element PE1. The material of the terminal electrodes may be gold or copper instead of silver described above. The method of forming the terminal electrodes can be sputtering, electroless plating, or the like instead of the printing.

In the first embodiment, as described above, when the electric field is generated between the individual electrodes 2 and the common electrodes 4, 19, the charge opposite to that on the common electrode 19 does not appear on the lower surface of the piezoelectric layer 9, i.e., on the end face (the one end face of the multilayer body LA1) opposite in the stack direction to the end face with the external electrodes 17, 18 thereon. For this reason, even in the case where the lower surface of the piezoelectric layer 9 is used as a working surface to be brought into direct contact with a liquid, the liquid located near the lower surface of the piezoelectric layer 9 is not charged with the charge opposite to that on the common electrode 19. Therefore, the liquid located near the lower surface of the piezoelectric layer 9 is not attracted by the electric field generated between the individual electrode 2 and the common electrode 19, so as to be prevented from penetrating into the multilayer body LA1. In consequence, it is feasible to suppress the insulation deterioration of the multilayer piezoelectric element PE1.

Incidentally, a conceivable configuration for preventing the liquid from penetrating into the multilayer body LA1 is to provide the lower surface of the piezoelectric layer 9 with a protecting layer. However, where the lower surface is provided with the protecting layer, the protecting layer can be a factor to inhibit the displacement of the active parts 21, so as to decrease the displacement. A conceivable technique of compensating for the decrease of displacement due to the protecting layer is to enlarge the element, i.e., to increase the number of piezoelectric layers, but it increases the size of the element and the cost. However, since the multilayer piezoelectric element PE1 of the present embodiment is arranged to prevent the liquid from penetrating into the multilayer body LA1 as described above, there is no need for provision of the protecting layer, and it is thus free of the problem of increase in the size and cost of the element.

In the first embodiment, the lower surface of the piezoelectric layer 9 serves as a working surface in contact with the liquid, whereupon the common electrode 19 is not in direct contact with the liquid. For this reason, the piezoelectric layer 9 also functions as a protecting layer to protect the common electrode 19 from the liquid. Since the piezoelectric layer 9 is made of the same piezoelectric material as the other piezoelectric layers 3, 5, it does not impede the displacement of the active parts 21.

In the fist embodiment, the whole surface in the piezoelectric layer 9 adjacent to the common electrode 19 is covered by the common electrode 19. This permits all the individual electrodes 2 adjacent in the stack direction to the common electrode 19, to be securely hidden by the common electrode 19 when viewed in the stack direction from the piezoelectric layer 9 side.

In the first embodiment, a plurality of individual electrodes 2 are arrayed in the matrix pattern. This permits the voltage to be independently applied to each of the individual electrodes 2, whereby a plurality of portions to be displaced, i.e., the active parts are included in one element.

It will be specifically described with Example 1 and Comparative Example 1 that the insulation deterioration can be suppressed by the first embodiment. In Example 1 and Comparative Example 1, the working surface side of the multilayer piezoelectric element was set upward, a liquid was dropwise delivered onto the working surface, a dc voltage was simultaneously applied to all the individual electrodes, and a time up to a drop of insulation resistance was measured. The working surface of the multilayer piezoelectric element is the end face opposite in the stack direction to the end face on which the terminal electrodes are formed. The dropwise delivered liquid was one in which pure water was a principal ingredient and in which glycerin and a nonionic surfactant were mixed. The dc voltage applied per thickness of the piezoelectric layers was 1 kV/mm. In each example, the number of samples of sheet laminates was 30.

The multilayer piezoelectric element PE1 of the first embodiment described above was used in Example 1. In Comparative Example 1, the multilayer piezoelectric element used was one in which the whole first internal electrode adjacent in the stack direction to the second internal electrode adjoining the outermost piezoelectric layer was not hidden by the second internal electrode adjoining the outermost piezoelectric layer, when viewed in the stack direction from the outermost piezoelectric layer side. The multilayer piezoelectric element of Comparative Example 1 had the same configuration as the multilayer piezoelectric element of Example 1, except that the whole first material electrode was not hidden by the second internal electrode.

In Example 1, no sample demonstrated a drop of insulation resistance at a point of 500 hours after a start of application of the dc voltage. The voltage application was continued up to 500 hours. In contrast to it, in Comparative Example 1 all the samples demonstrated a drop of insulation resistance with passage of 5 to 30 minutes after the start of application of the dc voltage.

The above confirmed the effectiveness of the first embodiment.

In this connection, the charge of the liquid dropwise delivered onto the working surface was measured in Example 1 in the applied state of the dc voltage of 1 kV/mm per thickness of the piezoelectric layers, but no potential change was observed between before and after the application of the voltage. On the other hand, the charge of the liquid dropwise delivered onto the working surface was also measured in Comparative Example 1 similarly in the applied state of the dc voltage of 1 kV/mm per thickness of the piezoelectric layers, and it was confirmed that the liquid was charged with the positive charge.

Therefore, the cause of the drop of insulation resistance in Comparative Example 1 is considered to be the phenomenon in which the liquid charged with the positive charge is attracted by the electric field between the first internal electrode and the second internal electrode to penetrate through grain boundaries in the outermost piezoelectric layer into the element. Specifically, it is considered to occur according to the following scenario. When the liquid entering the element comes to contact the second internal electrode, pure water ($H_2O$) in the liquid is decomposed into hydrogen ($H_2$) and oxygen ($½ O_2$) by an electric current. When the evolving hydrogen is brought into contact with palladium in the second internal electrode, palladium swells to cause peeling between the second internal electrode and the outermost piezoelectric layer. The peeling between the second internal electrode and the outermost piezoelectric layer causes the liquid to further penetrate into between the second internal electrode and the outermost piezoelectric layer, thereby inducing insulation failure or a short circuit between the second internal electrode and the first internal electrode.

The first embodiment showed the configuration wherein the whole surface in the piezoelectric layer 9 adjoining the common electrode 19 was covered by the common electrode 19, but the present invention is not limited to this configuration. As long as all the individual electrodes 2 adjacent in the stack direction to the common electrode 19 are hidden by the common electrode 19 when viewed in the stack direction from the piezoelectric layer 9 side, the periphery of the common electrode 19 may be located inside the periphery of the piezoelectric layer 9, i.e., a space may exist between the periphery of the piezoelectric layer 9 and the periphery of the common electrode 19.

However, where the periphery of the common electrode 19 is located inside the periphery of the piezoelectric layer 9, the electric field from the individual electrode 2 could pass through the portion of the piezoelectric layer 9 located between the periphery of the piezoelectric layer 9 and the periphery of the common electrode 19 to reach the working surface, and generate the same charge as that on the individual electrode 2 (the charge opposite to that on the common electrode 19), on the lower surface of the piezoelectric layer 9. For this reason, the whole surface in the piezoelectric layer 9 adjoining the common electrode 19 is preferably completely covered by the common electrode 19.

Second Embodiment

Figure 8:
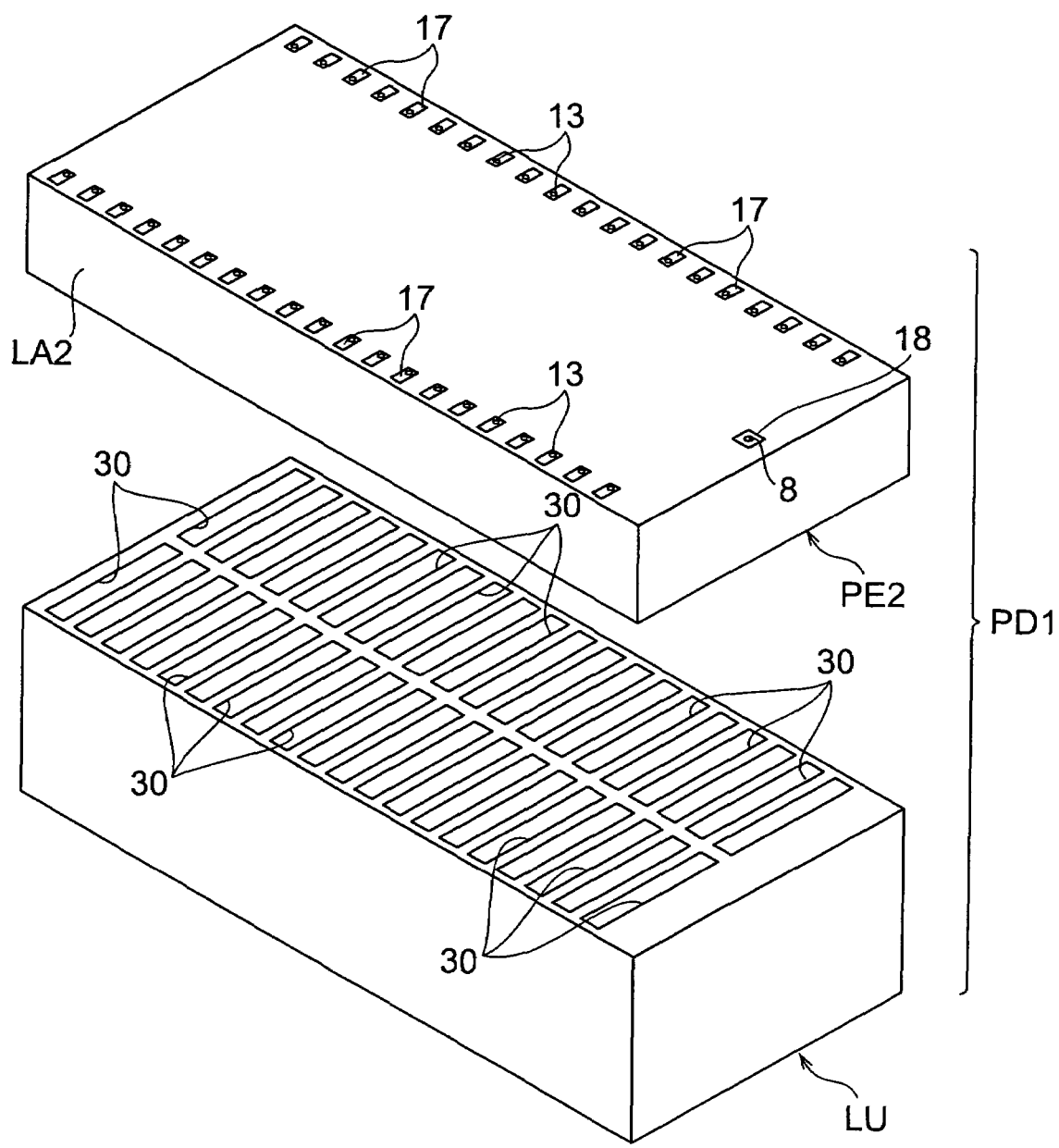
FIG. 8 is an exploded perspective view illustrating a piezoelectric device according to a second embodiment.
Figure 9:
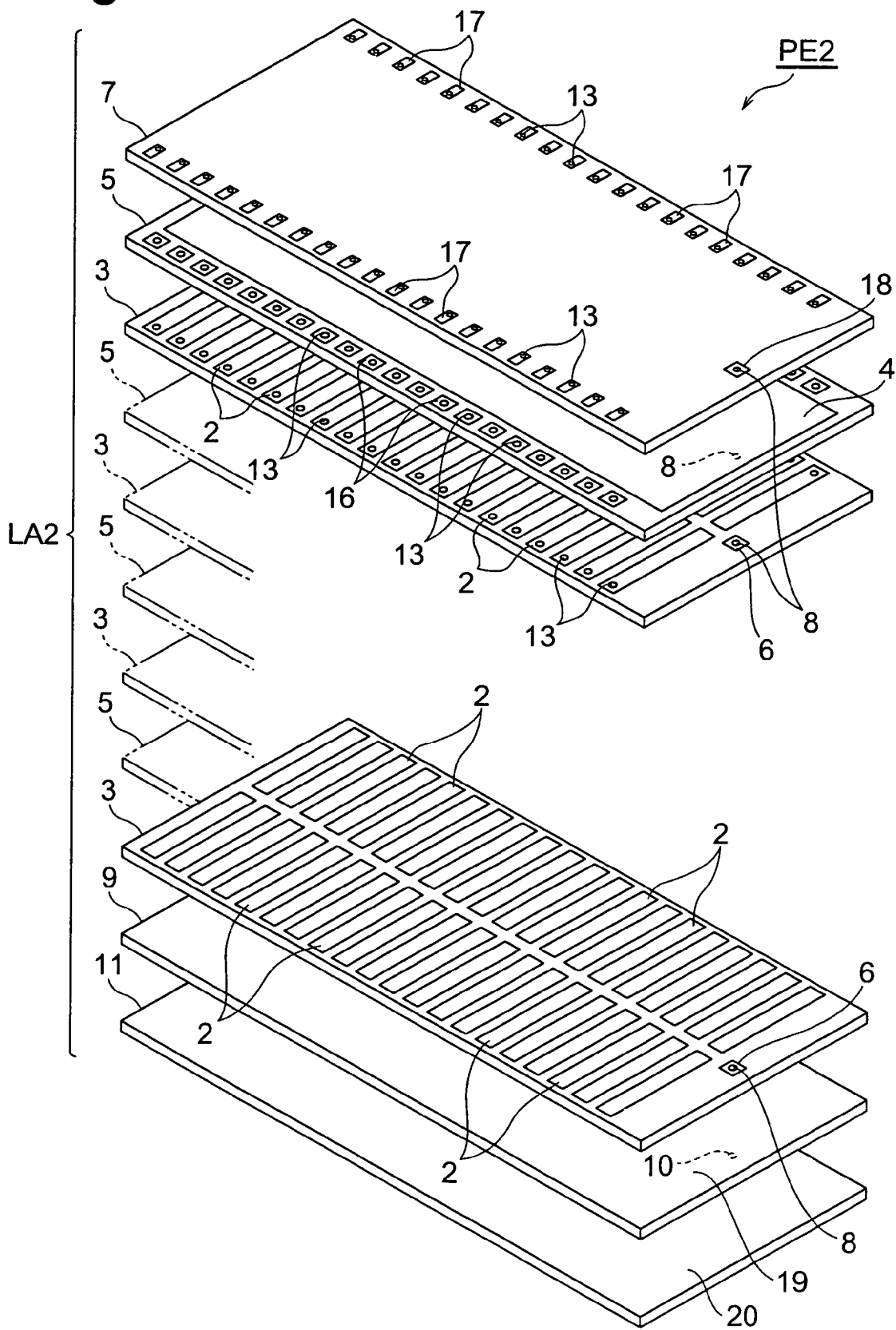
FIG. 9 is an exploded perspective view illustrating a multilayer piezoelectric element included in the piezoelectric device of the second embodiment.
Figure 10:
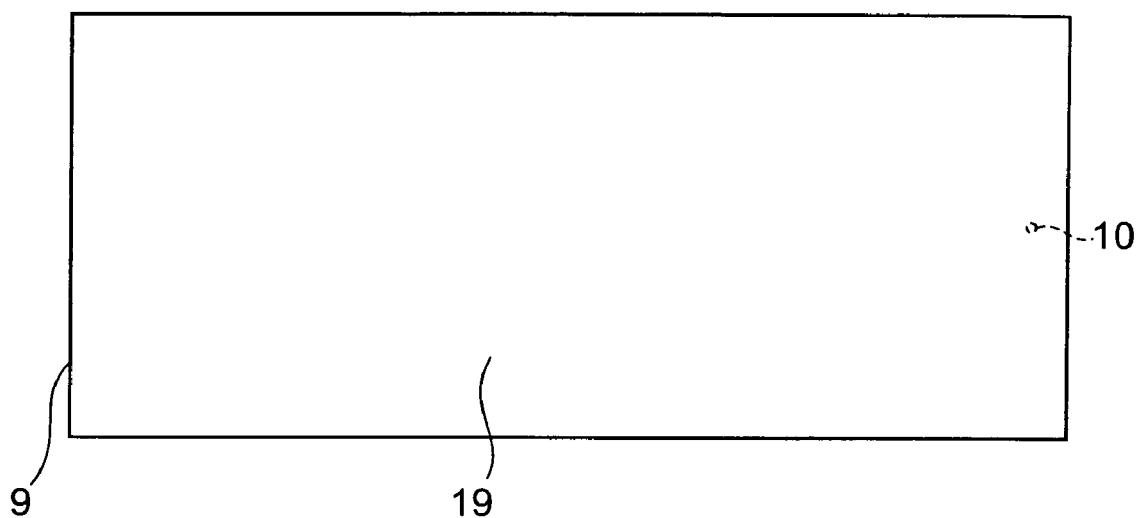
FIG. 10 is a schematic diagram illustrating a piezoelectric layer with a common electrode formed thereon, in the multilayer piezoelectric element illustrated in FIG. 9.
Figure 11:
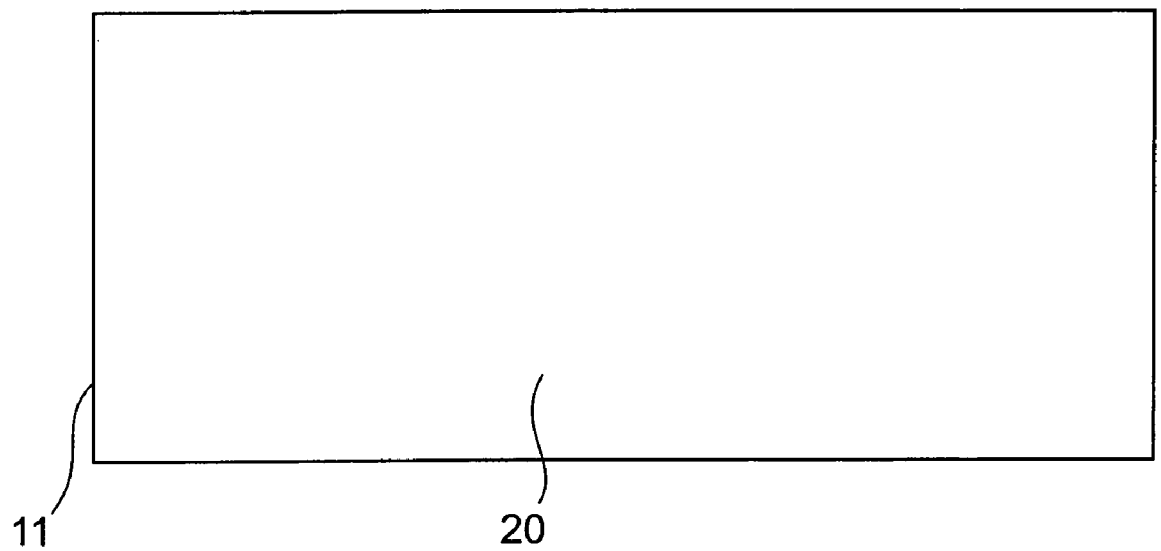
FIG. 11 is a schematic diagram illustrating a piezoelectric layer with a shield electrode formed thereon, in the multilayer piezoelectric element illustrated in FIG. 9.
Figure 12:
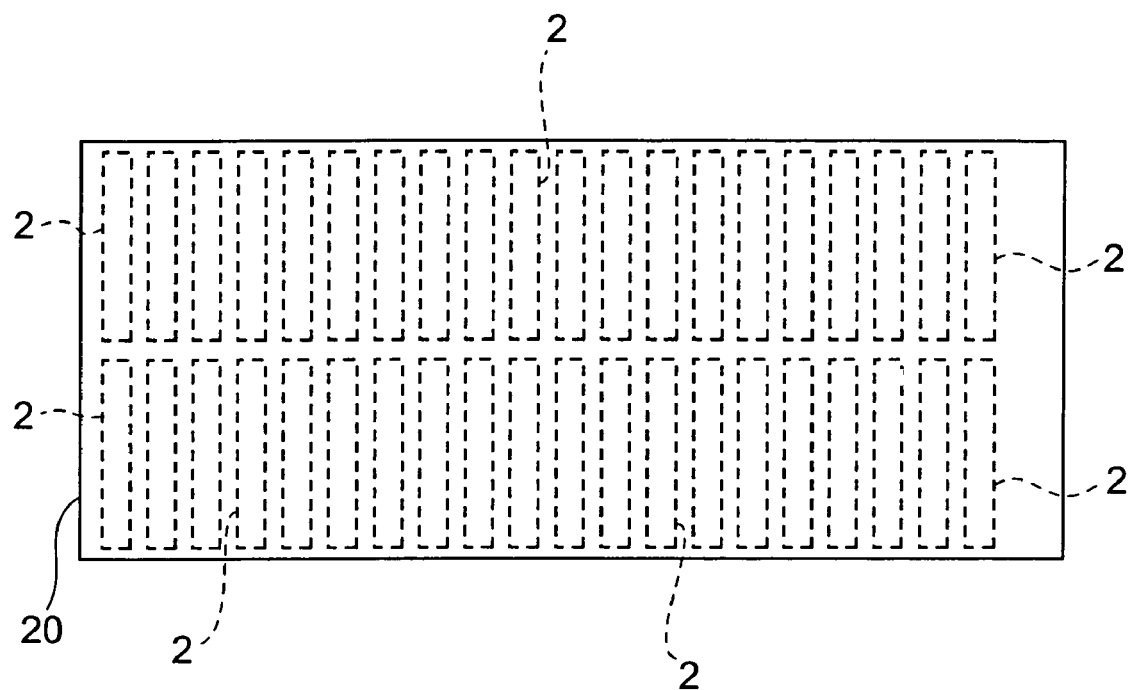
FIG. 12 is a schematic diagram illustrating individual electrodes and a common electrode in the multilayer piezoelectric element illustrated in FIG. 9.

Next, a configuration of a piezoelectric device PD1 according to the second embodiment will be described on the basis of FIGS. 8 to 13. FIG. 8 is an exploded perspective view illustrating the piezoelectric device of the second embodiment. FIG. 9 is an exploded perspective view illustrating the multilayer piezoelectric element included in the piezoelectric device of the second embodiment. FIG. 10 is a schematic diagram illustrating a piezoelectric layer with a common electrode formed thereon, in the multilayer piezoelectric element illustrated in FIG. 9. FIG. 11 is a schematic diagram illustrating a piezoelectric layer with a shield electrode formed thereon, in the multilayer piezoelectric element illustrated in FIG. 9. FIG. 12 is a schematic diagram illustrating individual electrodes and a shield electrode in the multilayer piezoelectric element illustrated in FIG. 9. FIG.

13 is a schematic diagram illustrating a sectional configuration of the piezoelectric device of the second embodiment.

The piezoelectric device PD1, as shown in FIG. 8, is provided with a multilayer piezoelectric element PE2 and a liquid chamber unit LU. The multilayer piezoelectric element PE2 and the liquid chamber unit LU are bonded to each other with resin or the like.

The multilayer piezoelectric element PE2 is different from the multilayer piezoelectric element PE1 of the first embodiment in that the piezoelectric element PE2 has a piezoelectric layer 11 with a shield electrode 20 formed thereon. The configuration of the multilayer piezoelectric element PE2 will be described below with focus on the difference from the multilayer piezoelectric element PE1.

The multilayer piezoelectric element PE2 is provided with a multilayer body LA2 of rectangular parallelepiped shape. The multilayer body LA2, as shown in FIG. 9, is constructed of an alternate stack of piezoelectric layers 3 and piezoelectric layers 5 four each, and a piezoelectric layer 7 and piezoelectric layers 9, 11 arranged to interpose the stack in between from top and bottom. Individual electrodes 2 (first internal electrode) are formed on each of the piezoelectric layers 3. A common electrode 4 (second internal electrode) is formed on each of the piezo electric layers 5. External electrodes 17, 18 are formed on the piezoelectric layer 7. A common electrode 19 (second internal electrode) is formed on the piezoelectric layer 9. A shield electrode 20 is formed on the piezoelectric layer 11. The piezoelectric layer 11 is an outermost piezoelectric layer and constitutes one end face in the stack direction of the multilayer body LA2 (in the second embodiment the "stack direction of the multilayer body LA2" will be referred to hereinafter simply as "stack direction"). The piezoelectric layer 7 is an outermost piezoelectric layer and constitutes the other end face in the stack direction.

The piezoelectric layer 11 is made, for example, of a piezoelectric ceramic material comprising lead zirconate titanate (PZT) as the main component and having the powder density of 8000 kg/m$^3$ as the piezoelectric layers 3, 5, 7, 9 are. The piezoelectric layer 11 is formed in a rectangular thin plate shape of "10 mm×30 mm, and 15 μm thick." In the second embodiment the piezoelectric layer 9 is also formed in a rectangular thin plate shape of "10 mm×30 mm, and 15 μm thick." The shield electrode 20 is made of a material comprising silver and palladium as the main component and formed in a pattern by screen printing as the individual electrodes 2, common electrodes 4, 19, and external electrodes 17, 18 are.

The common electrode 19 of rectangular shape is formed, as shown in FIG. 10, on the upper surface of the tenth piezoelectric layer 9 as counted from the piezoelectric layer 7 of the uppermost layer. In this configuration, the common electrode 19 is located at the extreme end in the stack direction among the electrodes 2, 4, 19, i.e., located at the position closest to one end face of the multilayer body LA2 among the electrodes 2, 4, 19, so as to adjoin the piezoelectric layer 9. The common electrode 19 is connected to an electroconductive member in a through hole 8 formed in the piezoelectric layer 5 so as to face an intermediate electrode 6 on the piezoelectric layer 3 in the stack direction, as the common electrode 4 is. The common electrode 19 is also connected to an electroconductive member in a through hole 10 formed in the piezoelectric layer 9.

Figure 13:
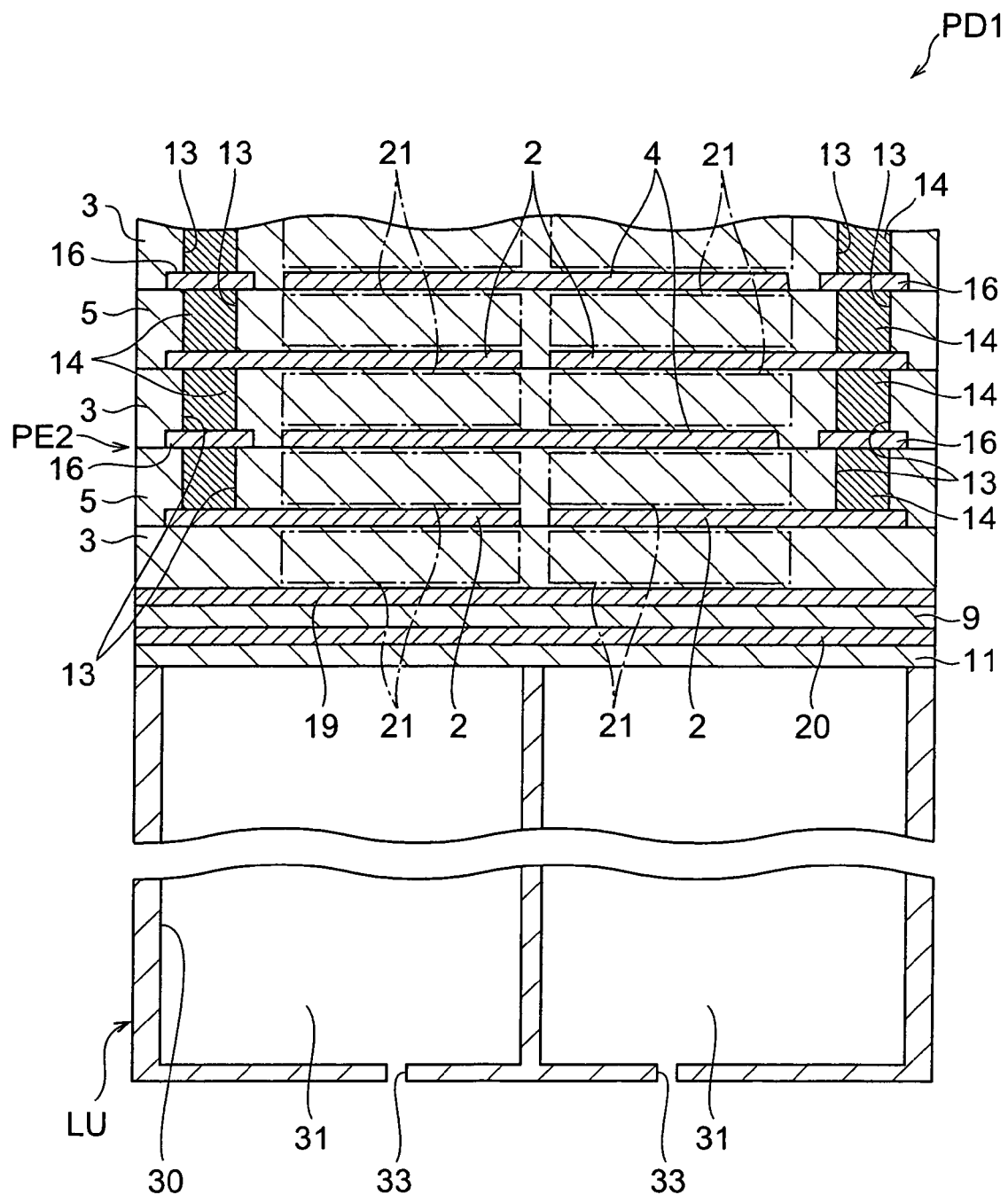
FIG. 13 is a schematic diagram illustrating a sectional configuration of the piezoelectric device according to the second embodiment.

The common electrode 19 is formed in the same shape as the piezoelectric layer 9, when viewed from the stack direction. Namely, the common electrode 19 is solidly formed over the surface of the piezoelectric layer 9 so that the common electrode 19 covers the whole surface in the piezoelectric layer 9 adjacent to the common electrode 19 (the surface on which the common electrode 19 is formed). In this configuration, as shown in FIGS. 6 and 13, all the individual electrodes 2 adjacent in the stack direction to the common electrode 19 are hidden by the common electrode 19 when viewed in the stack direction from the piezoelectric layer 9 side.

The shield electrode 20 of rectangular shape is formed, as shown in FIG. 11, on the upper surface of the eleventh (lowermost) piezoelectric layer 11 as counted from the piezoelectric layer 7 of the uppermost layer. In this configuration, the shield electrode 20 is located outside the common electrode 19 in the stack direction so as to adjoin the common electrode 19. The shield electrode 20 is connected to an electroconductive member in a through hole 10 formed in the piezoelectric layer 9 and is electrically connected through the electroconductive member to the common electrode 19.

The shield electrode 20 is formed in the same shape as the piezoelectric layer 11 when viewed from the stack direction. Namely, the shield electrode 20 is solidly formed over the surface of the piezoelectric layer 11 so that the shield electrode 20 covers the whole surface in the piezoelectric layer 11 adjacent to the shield electrode 20 (the surface on which the shield electrode 20 is formed). In this configuration, all the individual electrodes 2 adjacent in the stack direction to the common electrode 19 are hidden by the shield electrode 20, as shown in FIGS. 12 and 13, when viewed in the stack direction from the piezoelectric layer 11 side.

As the piezoelectric layers 3, 5, 7, 9, 11 with the electrode patterns as described above are stacked, four individual electrodes 2 are aligned with the intermediate electrode 16 in between each two of them in the thickness direction, with respect to each external electrode 17 on the uppermost layer. The electrodes 2, 16, 17 aligned are electrically connected by the electroconductive members in the through holes 13. More specifically, as shown in FIG. 13, individual electrodes 2, 2 adjacent to each other in the thickness direction are electrically connected by the electroconductive members 14 in the through holes 13 with the intermediate electrode 16 in between.

On the other hand, with respect to the external electrode 18 on the uppermost layer, four common electrodes 4 and the common electrode 19 on the lowermost layer are aligned in the stack direction with the intermediate electrode 6 in between each two of them. The electrodes 4, 6, 18, 19 thus aligned are electrically connected by the electroconductive members in the through holes 8. The common electrode 19 is electrically connected to the shield electrode 20 by the electroconductive member in the through hole 10, as described above.

In this electrical connection in the multilayer piezoelectric element PE2, when a voltage is applied between a predetermined external electrode 17 and the external electrode 18 (e.g., when the external electrode 17 is kept at a positive potential and the external electrode 18 at a negative potential), the voltage is applied between the individual electrodes 2 aligned under the predetermined external electrode 17, and the common electrodes 4, 19. This results in generating an electric field in the portions interposed between the portions except for the outside ends of the individual electrodes 2, and the common electrodes 4, 19, as shown in FIG. 13, in the piezoelectric layers 3, 5 and displacing the interposed portions as active parts 21. By selecting an external electrode 17 to which the voltage is applied, therefore, the active parts 21 aligned under the selected external electrode 17 can be displaced in the thickness direction among the active parts 21 corresponding to the individual electrodes 2 arranged in the matrix pattern.

When the electric field is generated between the portions except for the outside ends of the individual electrodes 2, and the common electrodes 4, 19, the common electrode 19 and the shield electrode 20 become approximately equipotential; and an equipotential region is formed between the common electrode 19 and the shield electrode 20. Since all the individual electrodes 2 adjacent in the stack direction to the common electrode 19 are hidden by the common electrode 19 and the shield electrode 20 when viewed in the stack direction from the piezoelectric layer 11 side, the same charge as that on the individual electrodes 2, i.e., the charge opposite to that on the common electrode 19 and on the shield electrode 20 is not generated on the lower surface of the piezoelectric layer 11 (one end face of the multilayer body LA2).

A plurality of holes 30 are formed in the liquid chamber unit LU, as shown in FIGS. 8 and 13. The holes 30 are arranged in a matrix pattern corresponding to the individual electrodes 2, i.e., corresponding to the active parts 21. The holes 30 are arranged, for example, in a matrix of two rows and seventy five columns (the drawing shows a matrix of two rows and twenty columns for clarity).

The liquid chamber unit LU is attached in contact to one end face of the multilayer piezoelectric element PE2 (multilayer body LA2). In this configuration, a liquid chamber 31 is defined by each hole 30 and the piezoelectric layer 11 being one end face of the multilayer body LA2. The region in the piezoelectric layer 11 corresponding to the hole 30 comes to front the liquid chamber 31. Each liquid chamber 31 is arranged adjacent to one side face of the multilayer body LA2.

Each liquid chamber 31 is in communication with an unrepresented liquid supply source. A liquid from the liquid supply source is stored in each liquid chamber 31. The liquid chamber unit LU has apertures 33 formed for the respective liquid chambers 31 so that each aperture is in communication with the associated liquid chamber 31. As the corresponding active parts 21 are displaced as described above, the volume of the liquid chamber 31 decreases to eject the liquid in an amount corresponding to the decrease of the volume of the liquid chamber 31, from the aperture 33.

Incidentally, since the common electrode 19 is formed in the same shape as the piezoelectric layer 9 when viewed from the stack direction, all the liquid chambers 31 are hidden by the common electrode 19 when viewed in the stack direction from the multilayer body LA2 side, as shown in FIG. 13. In addition, since the shield electrode 20 is formed in the same shape as the piezoelectric layer 11 when viewed from the stack direction, all the liquid chambers 31 are also hidden by the shield electrode 20 when viewed in the stack direction from the multilayer body LA2 side, as shown in FIG. 13.

Now, a production procedure of the aforementioned multilayer piezoelectric element PE2 will be described below. First, an organic binder, an organic solvent, etc. are mixed into a piezoelectric material comprising a ceramic such as lead zirconate titanate as the main component, to prepare a substrate paste. Then, using the substrate paste thus prepared, source sheets (green sheets) for the respective piezoelectric layers 3, 5, 7, 9, 11 are formed. An organic binder, an organic solvent, etc. are mixed into a metal material comprising silver (Ag) and palladium (Pd) at a predetermined ratio (e.g., Ag:Pd=7:3) to prepare an electroconductive paste for formation of electrode patterns. The electroconductive paste for formation of electrode patterns may be a metal material comprising silver.

Subsequently, laser light is projected to predetermined positions on the source sheets for the reactive piezoelectric layers 3, 5, 7, 9 to form the through holes 8, 10, 13. The laser used at this time is a third harmonic laser of YAG. The diameter of the through holes 8, 10, 13 is determined in the range of 40 to 50 μm. Next, the electroconductive members are formed in the through holes 8, 10, 13. The electroconductive members are formed by filling screen printing with the aforementioned electroconductive paste.

Next, an electrode pattern corresponding to the individual electrodes 2 is formed on each of the source sheets for the piezoelectric layers 3. An electrode pattern corresponding to the common electrode 4 and intermediate electrodes 16 is formed on each of the source sheets for the piezo electric layers 5. An electrode pattern corresponding to the common electrode 19 is formed on the source sheet for the piezoelectric layer 9. An electrode pattern corresponding to the shield electrode 20 is formed on the source sheet for the piezoelectric layer 11. An electrode pattern corresponding to the external electrodes 17, 18 is formed on the source sheet for the piezoelectric layer 7. Each of the electrode patterns is formed by screen printing with the aforementioned electroconductive paste.

Next, the source sheets with the respective electrode patterns formed thereon are stacked in the aforementioned order. Thereafter, the eleven stacked source sheets are pressed in the stack direction under the pressure of 100 MPa with heat at 60° C. to prepare a green laminate. The green laminate thus prepared is cut into a predetermined size. The cut green laminate is degreased at about 400° C. Thereafter, the green laminate is baked at about 1100° C. in a hermetically closed sagger for two hours to obtain a sintered body in the size of 10 mm×30 mm.

Next, silver printed electrodes are provided on the respective external electrodes 17, 18 on the sintered sheet for the piezoelectric layer 7 thereby forming the terminal electrodes for lead connection. Thereafter, a polarization process is carried out at the temperature of 120° C. for three minutes so as to achieve the field intensity of 3 kV/mm, thereby obtaining the multilayer piezoelectric element PE2. The material of the terminal electrodes may be gold or copper instead of silver described above. The method of forming the terminal electrodes can be sputtering, electroless plating, or the like instead of the printing.

In the second embodiment, as described above, when the electric field is generated between the portions except for the outside ends of the individual electrodes 2, and the common electrodes 4, 19, the same charge as that on the individual electrodes 2, i.e., the charge opposite to that on the common electrode 19 and on the shield electrode 20 is not generated on the lower surface of the piezoelectric layer 11 (one end face of the multilayer body LA2). For this reason, even in the case where the lower surface of the piezoelectric layer 11 is used as a working surface to be brought into direct contact with a liquid, when the electric field is generated between the portions except for the outside ends of the individual electrodes 2, and the common electrodes 4, 19, the liquid located near the lower surface of the piezoelectric layer 11 becomes charged with the same charge as the common electrode 19 (shield electrode 20), but is not charged with the charge opposite to that on the common electrode 19 (shield electrode 20). Therefore, the liquid located near the lower surface of the piezoelectric layer 11 is not attracted by the electric field generated between the portions except for the outside ends of the individual electrodes 2, and the common electrodes 4, 19, so as to be prevented from penetrating into the multilayer body LA2.

Since in the second embodiment the shield electrode 20 is electrically connected to the common electrode 19, an equipotential region is formed between the shield electrode 20 and the common electrode 19. Therefore, even if the liquid in direct contact with the lower surface of the piezoelectric layer 11 is charged with the charge opposite to that on the common electrode 19 (shield electrode 20) because of influence of the electric fields caused by various components, devices, etc. disposed around the piezoelectric device PD1, the liquid is prevented from penetrating the aforementioned equipotential region into the multilayer body LA2. Particularly, where the aforementioned electroconductive paste contains silver, ion migration could occur in the event of contact of the shield electrode 20 with the liquid. However, since the equipotential region is formed between the shield electrode 20 and the common electrode 19, the occurrence of ion migration can be suppressed.

As seen from the above, the second embodiment successfully suppresses the insulation deterioration of the piezoelectric device PD1, particularly, the multilayer piezoelectric element PE2.

In the second embodiment, the whole piezoelectric layer 9 adjoining the common electrode 19 is covered by the common electrode 19, and the whole piezoelectric layer 11 adjoining the shield electrode 20 is covered by the shield electrode 20. This permits all the individual electrodes 2 adjacent in the stack direction to the common electrode 19, to be securely hidden by the common electrode 19 when viewed in the stack direction from the shield electrode 20 side. In addition, all the individual electrodes 2 adjacent in the stack direction to the common electrode 19 can be securely hidden by the shield electrode 20 when viewed in the stack direction from the shield electrode 20 side. All the liquid chambers 31 are hidden by the common electrode 19 when viewed in the stack direction from the multilayer body LA2 side, and all the liquid chambers 31 are also hidden by the shield electrode 20 when viewed in the stack direction from the multilayer body LA2 side.

The multilayer body LA2 has the piezoelectric layer 11 adjoining the shield electrode 20 and constituting one end face in the stack direction. In this configuration, the piezoelectric layer 11 serves as a working surface to be kept in contact with the liquid, so that the shield electrode 20 is not in direct contact with the liquid. As a result, the piezoelectric layer 11 also functions as a protecting layer to protect the shield electrode 20 from the liquid. Since the piezoelectric layer 11 is made of the same piezoelectric material as the other piezoelectric layers 3, 5, 7, it does not impede the performance of the active parts 21 in the multilayer piezoelectric element PE2.

In the second embodiment a plurality of individual electrodes 2 are arrayed in the matrix pattern. This permits the voltage to be independently applied to each individual electrode 2, whereby a plurality of portions to be displaced, i.e., the active parts are included in one element.

In the second embodiment the multilayer body LA2 has one layer of shield electrode 20, but the multilayer body LA2 may have multiple layers of shield electrode 20, without having to be limited to the configuration of the one-layer shield electrode 20. Where the multilayer body LA2 has multiple layers of shield electrode 20, it could inhibit the displacement of active parts 21 in the multilayer piezoelectric element PE2, and thus the number of layers of shield electrode 20 is preferably one.

In the second embodiment the multilayer body LA2 has the piezoelectric layer 11 adjoining the shield electrode 20 and constituting one end face in the stack direction, but the piezoelectric layer 11 is not always essential. Where the multilayer body LA2 is formed without the piezoelectric layer 11, the shield electrode 20 is kept in direct contact with the liquid. Therefore, in terms of protection of the shield electrode 20, the multilayer body LA2 is preferably formed with the piezoelectric layer 11, as described above.

In the second embodiment the thickness of each piezoelectric layer 9, 11 is set to half of the thickness of each piezoelectric layer 3, 5, 7, but, without having to be limited to this, the thickness of each piezoelectric layer 9, 11 may be set at the same as the thickness of each piezoelectric layer 3, 5, 7.

In the second embodiment the whole surface in the piezoelectric layer 9 adjoining the common electrode 19 is covered by the common electrode 19, but the present invention is not limited to this. As long as all the individual electrodes 2 adjacent in the stack direction to the common electrode 19 are hidden by the common electrode 19 when viewed in the stack direction from the piezoelectric layer 9 side, the periphery of the common electrode 19 may be located inside the periphery of the piezoelectric layer 9, i.e., a space may exist between the periphery of the piezoelectric layer 9 and the periphery of the common electrode 19. The whole surface in the piezoelectric layer 11 adjoining the shield electrode 20 is covered by the shield electrode 20, but the present invention is not limited to this. As long as all the individual electrodes 2 adjacent in the stack direction to the common electrode 19 are hidden by the shield electrode 20 when viewed in the stack direction from the piezoelectric layer 11 side, the periphery of the shield electrode 20 may be located inside the periphery of the piezoelectric layer 11, i.e., a space may exist between the periphery of the piezoelectric layer 11 and the periphery of the shield electrode 20.

However, where the periphery of the common electrode 19 is located inside the periphery of the piezoelectric layer 9 and where the periphery of the shield electrode 20 is located inside the periphery of the piezoelectric layer 11, the electric field from the individual electrodes 2 could pass through the portion of the piezoelectric layer 9 located between the periphery of the piezoelectric layer 9 and the periphery of the common electrode 19 and through the portion of the piezoelectric layer 11 located between the periphery of the piezoelectric layer 11 and the periphery of the shield electrode 20 to reach the working surface, and the same charge as that on the individual electrodes 2 (the charge opposite to that on the common electrode 19 and on the shield electrode 20) could be generated on the lower surface of the piezoelectric layer 11. For this reason, the whole surface in the piezoelectric layer 9 adjoining the common electrode 19 is preferably completely covered by the common electrode 19 and the whole surface in the piezoelectric layer 11 adjoining the shield electrode 20 is also preferably completely covered by the shield electrode 20.

Third Embodiment

Figure 14:
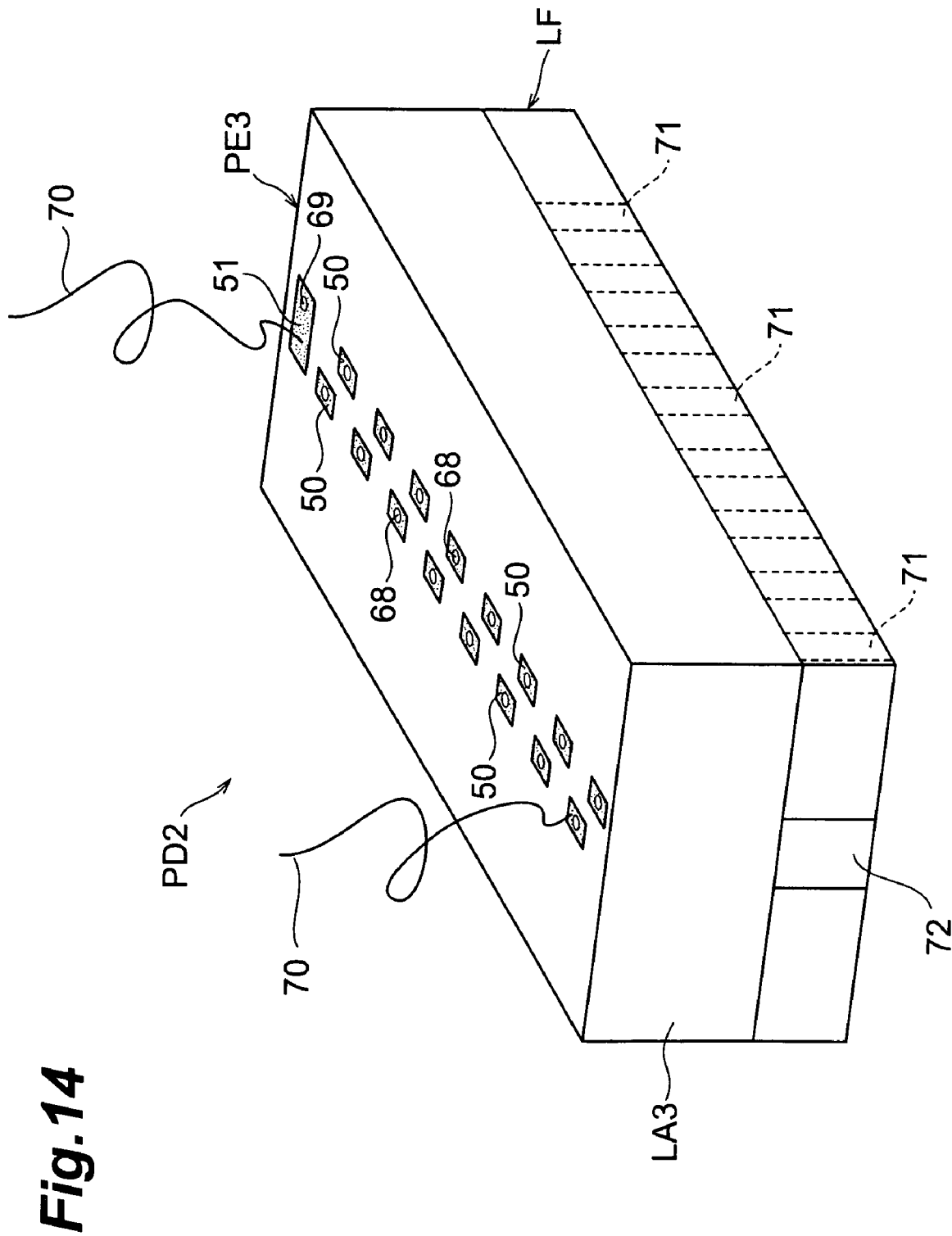
FIG. 14 is a perspective view illustrating a piezoelectric device according to a third embodiment.
Figure 15:
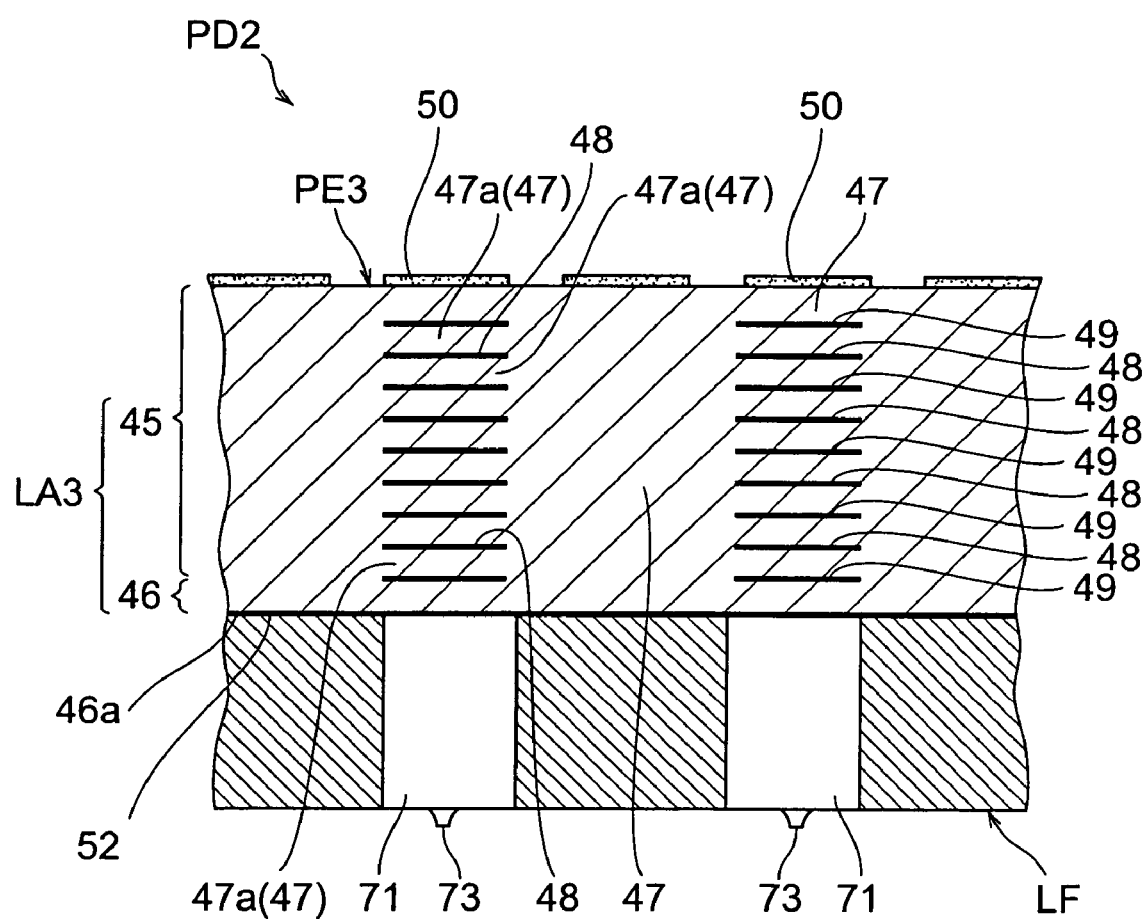
FIG. 15 is a partial sectional side view of the piezoelectric device illustrated in FIG. 14.

Next, a configuration of a piezoelectric device PD2 according to the third embodiment will be described on the basis of FIGS. 14 and 15. FIG. 14 is a perspective view illustrating the piezoelectric device of the third embodiment. FIG. 15 is a partial sectional side view of the piezoelectric device. In each drawing, the piezoelectric device PD2 of the present embodiment is, for example, a piezoelectric device for control of liquid used in a micropump unit.

The piezoelectric device PD2 is provided with a multilayer piezoelectric element PE3, and a liquid flow portion LF joined to the bottom surface of the piezoelectric element PE3. The piezoelectric element PE3 has a multilayer body LA3 of rectangular parallelepiped shape. The multilayer body LA3 is comprised of an active region layer 45, and a displacement transfer layer 46 disposed on the liquid flow portion LF side of the active region layer 45.

The active region layer 45 has piezoelectric layers 47, and a plurality of internal individual electrodes 48 and internal common electrodes 49 in plural layers. In order to implement expansion and contraction (displacement) of the piezoelectric layer 47, the plurality of internal individual electrodes 48 and internal common electrodes 49 are arranged so as to face each other with the piezoelectric layer 47 in between. The internal individual electrodes 48 and internal common electrodes 49 are alternately stacked through the piezoelectric layer 47. The internal electrode located at the lowermost position in the active region layer 45 serves as internal common electrode 49. A plurality of regions between internal individual electrode 48 and internal common electrode 49 in the piezoelectric layer 47 constitute piezoelectric active parts 47a that actually expand and contract with application of a voltage between internal individual electrode 48 and internal common electrode 49.

On the upper surface of the multilayer body LA3 there are provided a plurality of individual terminal electrodes 50 electrically connected to the respective internal individual electrodes 48 in each layer, and a common terminal electrode 51 electrically connected to the internal common electrode 49 in each layer.

The piezoelectric layer 47 is made, for example, of a piezoelectric ceramic material comprising PZT (lead zirconate titanate) as the main component. The internal individual electrodes 48 and internal common electrodes 49 are made, for example, of Ag and Pd. The individual terminal electrodes 50 and common terminal electrode 51 are made, for example, of Ag, Au, or Cu. The thickness of the piezoelectric layer 47 is, for example, approximately 20-50 µm. The thickness of the internal individual electrodes 48 and internal common electrodes 49 is, for example, approximately 0.2-5.0 µm.

The displacement transfer layer 46 laid below the active region layer 45 is a layer for transferring displacement of the piezoelectric active parts 47a of the piezoelectric layer 47 to a liquid flowing in the liquid flow portion LF. The displacement transfer layer 46 has a function of protecting the lowermost internal common electrode 49 in the active region layer 45. The displacement transfer layer 46 is preferably made of the same ceramic material as the piezoelectric layer 47. This permits the displacement transfer layer 46 and piezoelectric layer 47 to be made in the same step as described later, which facilitates production of the multilayer body LA3. The thickness of the displacement transfer layer 46 is, for example, approximately 20-40 µm. In this connection, it is effective to make the displacement transfer layer 46 thinner than the piezoelectric layer 47, because it becomes easier to transfer the displacement of the piezoelectric layer 47.

The displacement transfer layer 46 is a layer not subjected to a polarization process (described hereinafter), different from the active region layer 45. If the element is subjected to the polarization process, the element can become distorted to make a clearance between grain boundaries. However, when the displacement transfer layer 46 is formed as a nonpolarized layer, no such clearance is formed in the displacement transfer layer 46, thus achieving a structure wherein the liquid is unlikely to penetrate the displacement transfer layer 46. An end face (displacement transfer surface) 46a of the displacement transfer layer 46 on the liquid flow portion LF side is preferably a fired surface (natural surface) in a state in which it is not subjected to a mechanical surface treatment, such as polishing, after baking (described later). In this case, there are no fine defects due to the mechanical surface treatment in the displacement transfer surface 46a, and the liquid is thus unlikely to penetrate the displacement transfer layer 46 as described above.

A film with electric conductivity (hereinafter referred to simply as electroconductive film) 52 for applying a negative electric field to the liquid flowing in the liquid flow portion LF is formed on the displacement transfer surface 46a of the displacement transfer layer 46. The electroconductive film 52 covers almost the whole of the displacement transfer surface 46a of the displacement transfer layer 46 (cf. FIG. 21). The electroconductive film 52 is made of such a metal as Au, Ag, or Cu, or an organic polymer with electric conductivity (carbon-dispersed organic matter, or the like). The thickness of the electroconductive film 52 is preferably, for example, approximately 0.1-2.0 µm in terms of preventing the penetration of the liquid and preventing the inhibition of displacement of the active region layer 45.

Figure 16:
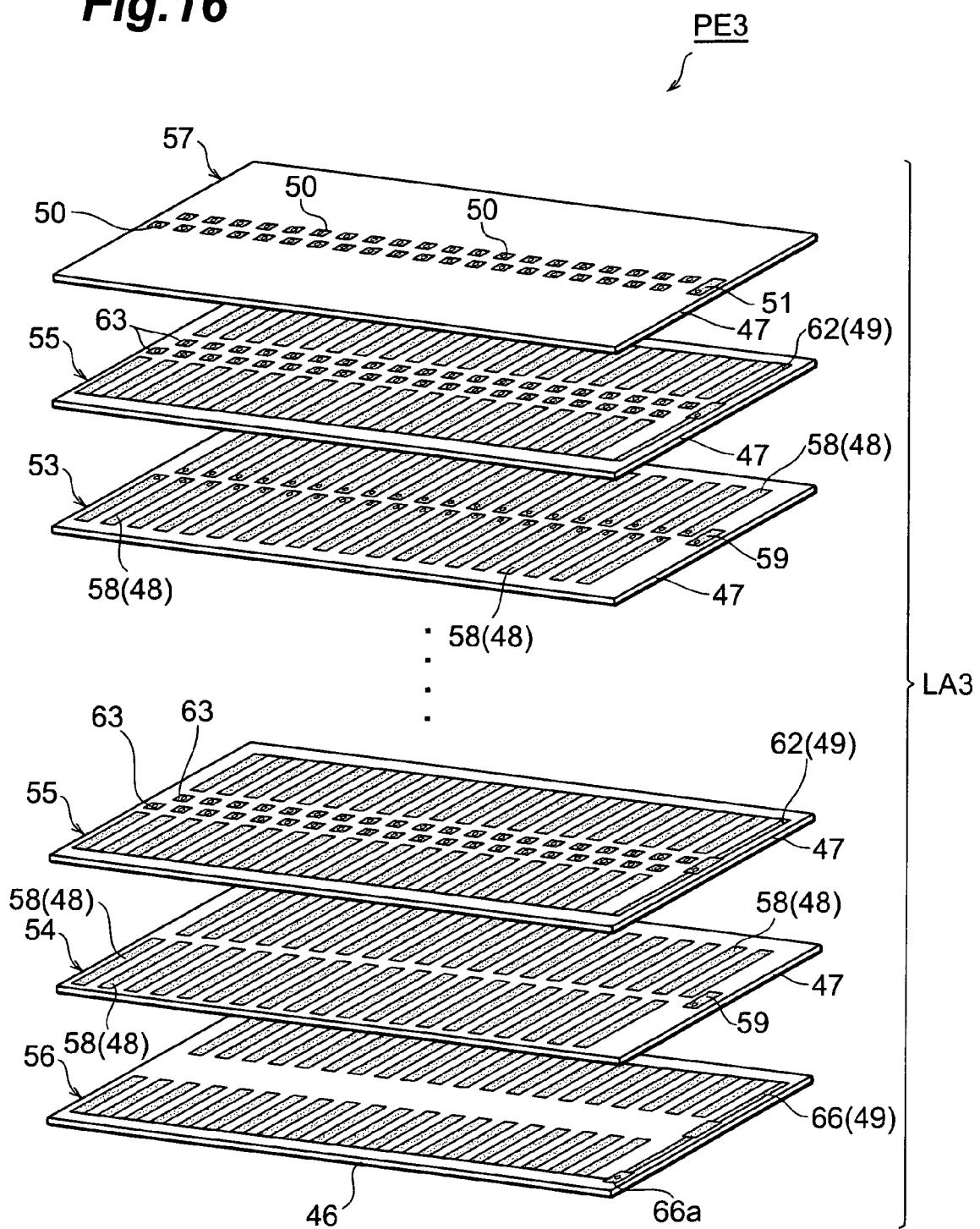
FIG. 16 is an exploded perspective view of a piezoelectric element illustrated in FIG. 15.

The piezoelectric element PE3, specifically, has the structure in which plural types (five types) of sheet-like electrode-attached ceramic layers 53-57 are stacked by a predetermined number (ten herein), as shown in FIG. 16. Internal individual electrodes 48 on each layer in the piezoelectric element PE3 are two-dimensionally arrayed on the upper surface of piezoelectric layer 47 of rectangular shape. In this connection, internal individual electrodes 48 adjacent to each other in the lateral direction of piezoelectric layer 47 are arranged with a shift in the longitudinal direction of piezoelectric layer 47. This secures the area of each piezoelectric active part 47a of piezoelectric layer 47 even in a case where a number of internal individual electrodes 48 are arranged in a high density, in order to achieve size reduction and high integration of the piezoelectric element PE3.

Figure 17:
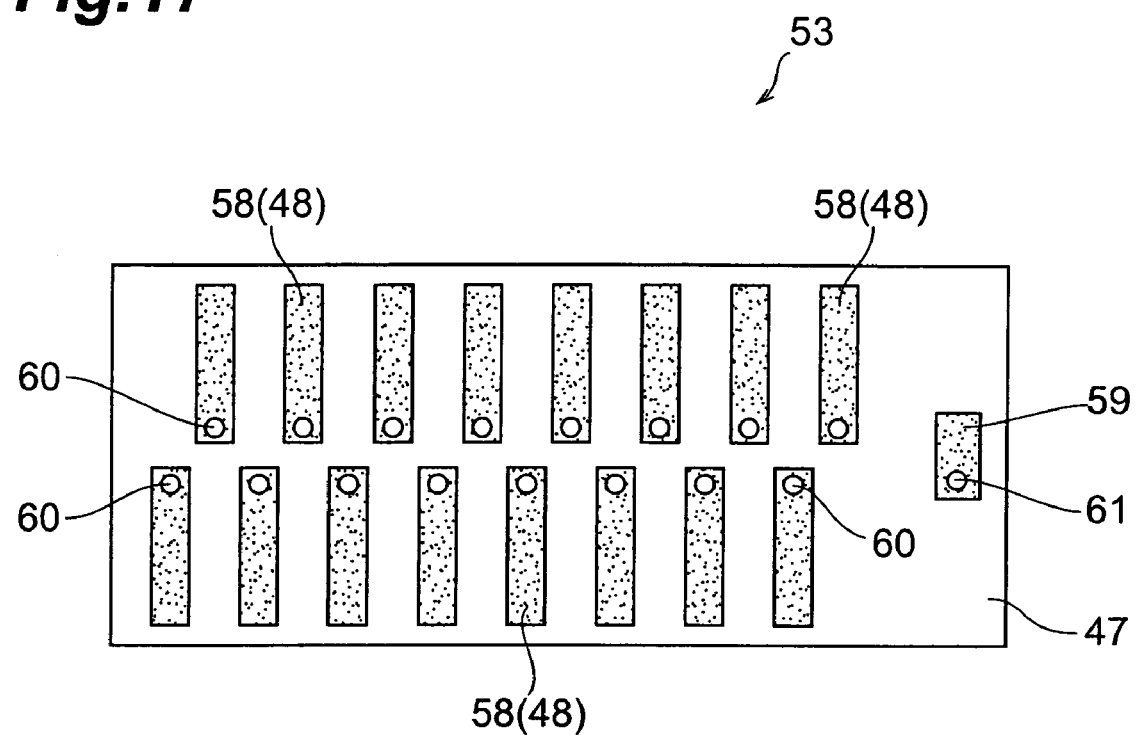
FIG. 17 is a plan view illustrating an electrode-attached ceramic layer illustrated in FIG. 16.

An electrode-attached ceramic layer 53, as shown in FIG. 17, has a plurality of individual electrode patterns 58 corresponding to the aforementioned internal individual electrodes 48, and a common electrode relay pattern 59 on the upper surface of piezoelectric layer 47. The common electrode relay pattern 59 is formed on one end region of the upper surface of the piezoelectric layer 47. The electrode-attached ceramic layer 53 is provided with a plurality of through holes 60 electrically connected to the respective internal individual electrodes 48, and a through hole 61 electrically connected to the common electrode relay pattern 59. The interior of the through holes 60, 61 is filled, for example, with an electroconductive material comprising Ag and Pd.

Figure 18:
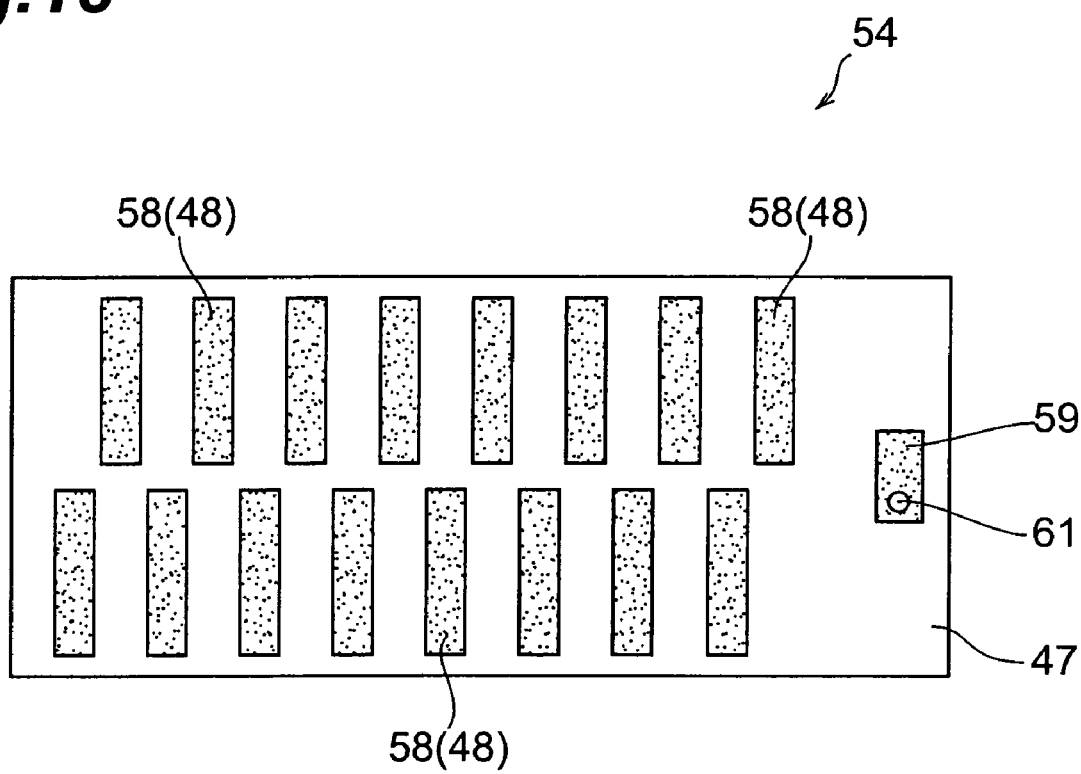
FIG. 18 is a plan view illustrating another electrode-attached ceramic layer illustrated in FIG. 16.

An electrode-attached ceramic layer 54, as shown in FIG. 18, has a plurality of individual electrode patterns 58 and a common electrode relay pattern 59 on the upper surface of piezoelectric layer 47 as the aforementioned electrode-attached ceramic layer 53 does. The electrode-attached ceramic layer 54 is provided with a through hole 61 as the electrode-attached ceramic layer 53 is, but is not provided with any through hole 60.

Figure 19:
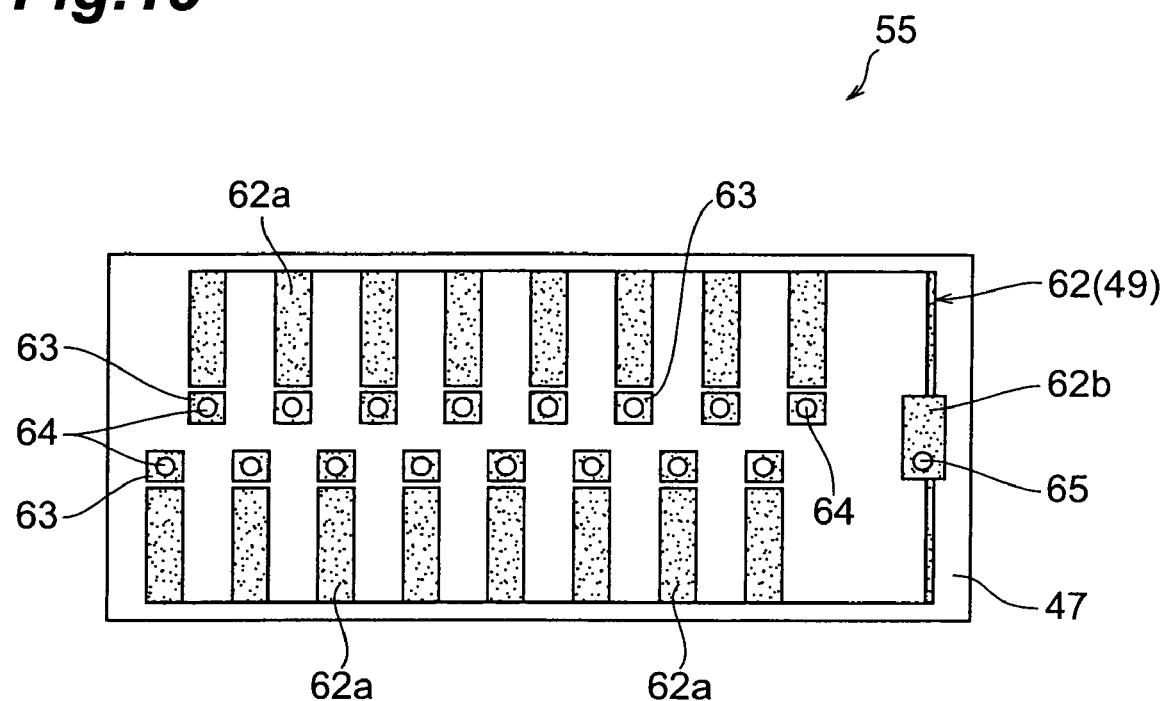
FIG. 19 is a plan view illustrating still another electrode-attached ceramic layer illustrated in FIG. 16.

An electrode-attached ceramic layer 55, as shown in FIG. 19, has a common electrode pattern 62 corresponding to the foregoing internal common electrode 49, and a plurality of individual electrode relay patterns 63 on the upper surface of the piezoelectric layer 47. The common electrode pattern 62 includes a plurality of electrode pattern portions 62a formed at positions corresponding to the respective individual electrode patterns 58, and an electrode pattern portion 62b formed at a position corresponding to the common electrode relay pattern 59. Each individual electrode relay pattern 63 is formed so as to be adjacent to an electrode pattern portion 62a at a position corresponding to the individual electrode pattern 58. The electrode-attached ceramic layer 55 is provided with a plurality of through holes 64 electrically connected to the respective individual electrode relay patterns 63, and a through hole 65 electrically connected to the common electrode pattern 62. The interior of the through holes 64, 65 is filled with an electroconductive material.

Figure 20:
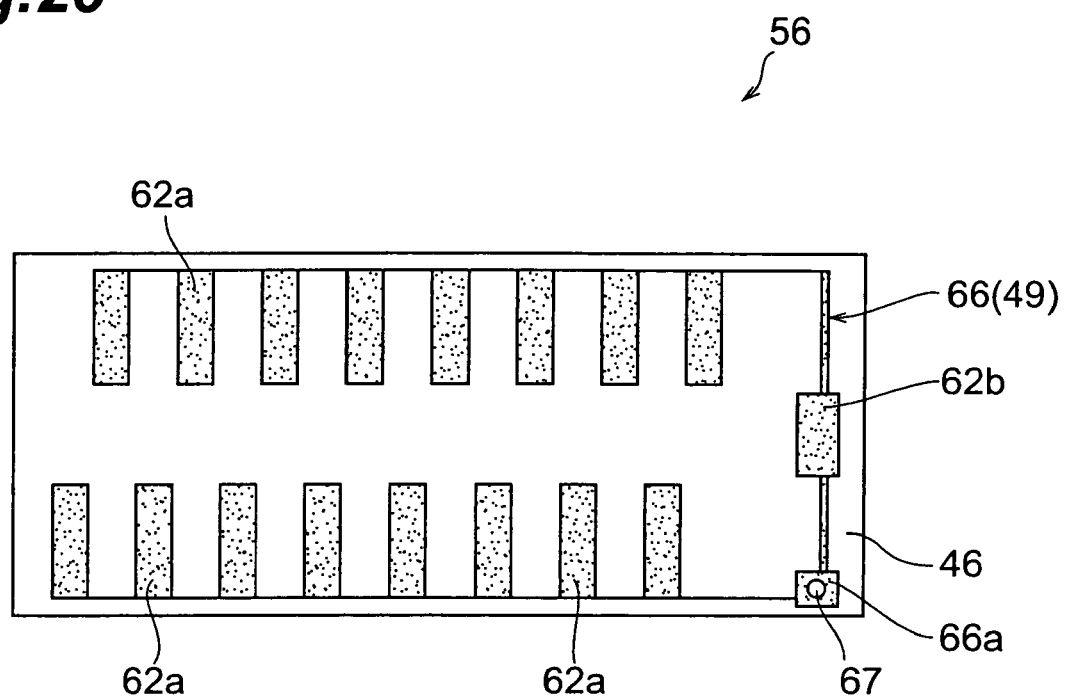
FIG. 20 is a plan view illustrating still another electrode-attached ceramic layer illustrated in FIG. 16.

An electrode-attached ceramic layer 56, as shown in FIG. 20, has a common electrode pattern 66 corresponding to the internal common electrode 49, on the upper surface of the displacement transfer layer 46. The common electrode pattern 66 includes an electrode pattern portion 66a for connection, in addition to the same electrode pattern portions 62a, 62b as those of the aforementioned electrode-attached ceramic layer 55. The electrode pattern portion 66a for connection is formed at a corner on the same side as the electrode pattern portion 62b, on the upper surface of the displacement transfer layer 46. The electrode pattern portion 66a for connection may be formed at a position on the opposite side to the electrode pattern portion 62b, on the upper surface of the displacement transfer layer 46. The electrode-attached ceramic layer 56 is provided with a through hole 67 electrically connected to the common electrode pattern 66. The through hole 67 is formed in a region corresponding to the electrode pattern portion 66a for connection in the displacement transfer layer 46. The interior of the through hole 67 is filled with an electroconductive material.

Figure 21:
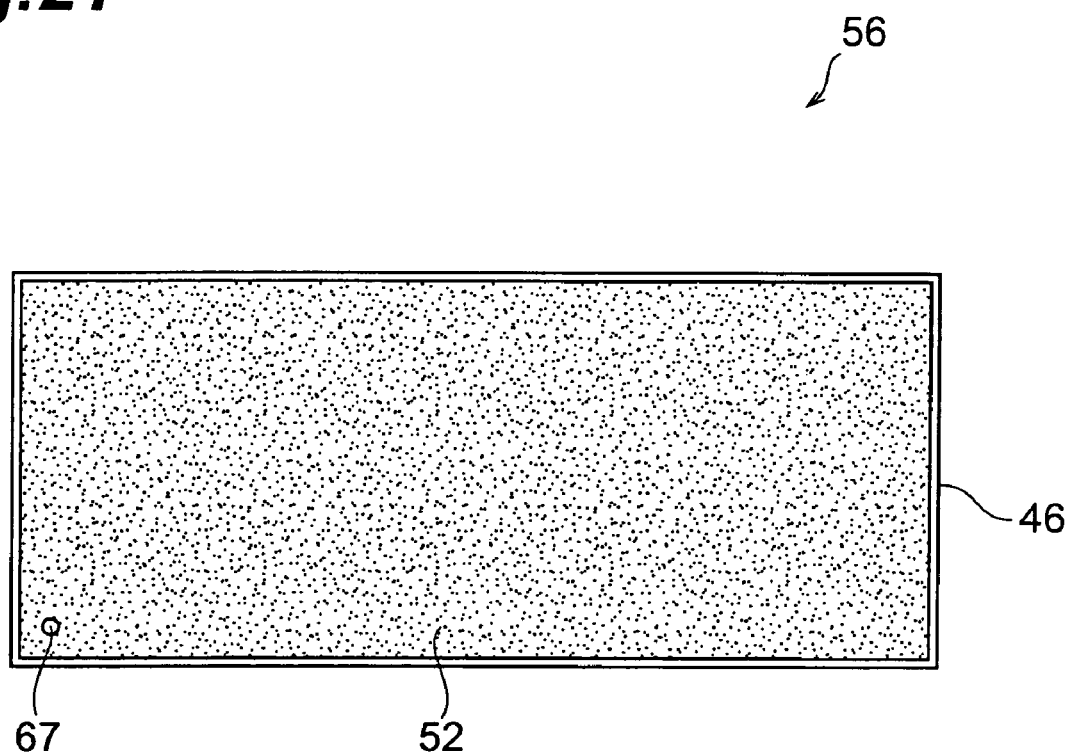
FIG. 21 is a bottom view of the electrode-attached ceramic layer illustrated in FIG. 20.

The aforementioned electroconductive film 52 is formed so as to cover substantially the entire surface of the displacement transfer layer 46, as shown in FIG. 21, on the lower surface of the electrode-attached ceramic layer 56. The electroconductive film 52 is electrically connected through the through hole 67 to the common electrode pattern 66.

Figure 22:
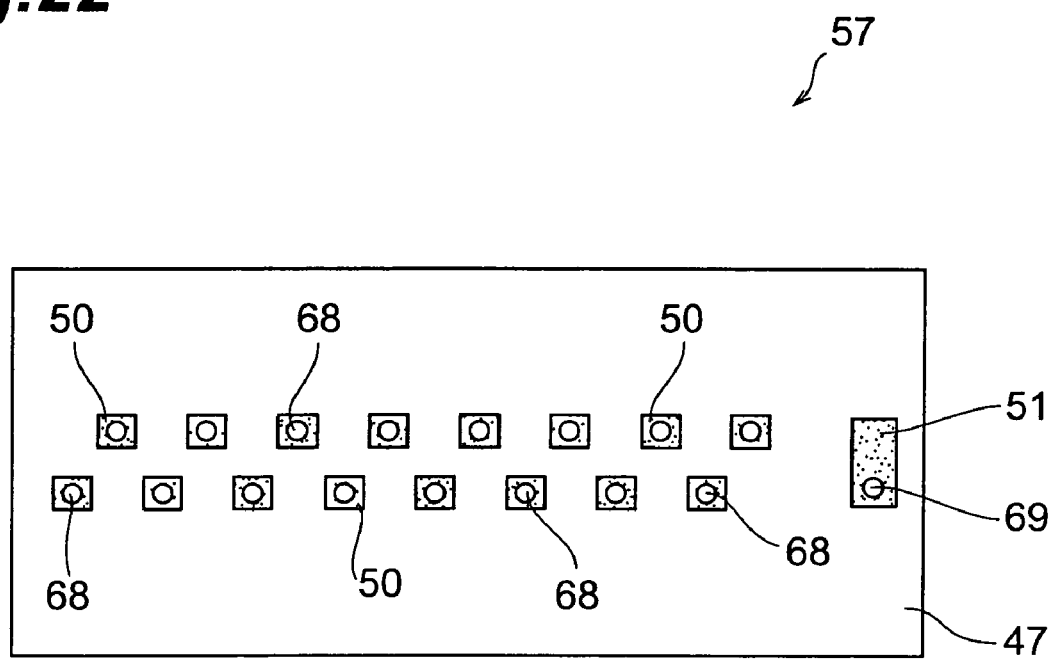
FIG. 22 is a plan view illustrating still another electrode-attached ceramic layer illustrated in FIG. 16.

An electrode-attached ceramic layer 57, as shown in FIG. 22, has the aforementioned individual terminal electrodes 50 and common terminal electrode 51 on the upper surface of the piezoelectric layer 47. The individual terminal electrodes 50 are formed at positions corresponding to the individual electrode relay patterns 63 of the electrode-attached ceramic layer 55. The common terminal electrode 51 is formed at a position corresponding to the common electrode relay pattern 59 on the aforementioned electrode-attached ceramic layer 53. The electrode-attached ceramic layer 57 is provided with a plurality of through holes 68 electrically connected to the respective individual terminal electrodes 50, and a through hole 69 electrically connected to the common terminal electrode 51. The interior of the through holes 68, 69 is filled with an electroconductive material.

The common electrode pattern 62 of the electrode-attached ceramic layer 55 may be of solid structure, without separating the plurality of electrode pattern portions 62a and the electrode pattern portion 62b as shown in FIG. 19. The same also applies to the common electrode pattern 66 of the electrode-attached ceramic layer 56.

The piezoelectric element PE3, as shown in FIG. 16, has the stacked structure of ceramic layer 57, ceramic layer 55, ceramic layer 53, ceramic layer 55, . . . , ceramic layer 53, ceramic layer 55, ceramic layer 54, and ceramic layer 56 in the descending order from above. Each individual terminal electrode 50 is electrically connected through the through hole 68 of the ceramic layer 57, the individual electrode relay patterns 63 and through holes 64 of the ceramic layers 55, and the individual electrode patterns 58 and through holes 60 of the ceramic layers 53 to the individual electrode pattern 58 of the ceramic layer 54 of the second layer from bottom. The common terminal electrode 51 is electrically connected through the through hole 69 of the ceramic layer 57, the common electrode patterns 62 and through holes 65 of the ceramic layers 55, the common electrode relay patterns 59 and through holes 61 of the ceramic layers 53, and the common electrode relay pattern 59 and through hole 61 of the ceramic layer 54 to the common electrode pattern 66 of the ceramic layer 56 of the lowermost layer.

Referring back to FIGS. 14 and 15, a lead wire 70 for application of voltage is joined to each of individual terminal electrodes 50 and common terminal electrode 51 by solder or the like. The lead wires 70 are comprised, for example, of a flexible printed circuit board (FPC).

The liquid flow portion LF located on the back side of the piezoelectric element PE3 described above, i.e., on the displacement transfer surface 46a side has a plurality of liquid chambers 71 for accommodating a liquid to which the displacement of the piezoelectric layer 47 is transferred. Each liquid chamber 71 is formed at a position corresponding to an internal individual electrode 48. A liquid inlet 72 for guiding the liquid to each liquid chamber 71 is provided on one end side of the liquid flow portion LF In the bottom part of the liquid flow portion LF there are provided a plurality of liquid outlets 73 for letting the liquid out of the liquid chambers 71 upon transfer of displacement of the piezoelectric layer 47 to the liquid. The liquid flow portion LF is made of a metal material such as nickel alloy steel or chromium alloy steel, a resin, a ceramic, or the like.

Next, a procedure of producing the above-described piezoelectric device PD2 will be described. First the piezoelectric element PE3 is prepared as described below.

Namely, for example, a piezoelectric ceramic comprising PZT as the main component is prepared, and an organic binder, an organic solvent, etc. are mixed thereinto to prepare a paste. Then a sheet forming process with the paste is carried out using PET film as carrier film, thereby forming ceramic green sheets for the aforementioned piezoelectric layer 47 and displacement transfer layer 46.

Subsequently, for example, a third harmonic laser beam of YAG is projected to predetermined positions of each green sheet to perforate it, thereby forming through holes in the green sheet. At this time, the through holes are processed so that the diameter of the holes becomes, for example, 40-50 μm after baking described later. Then an organic binder, an organic solvent, etc. are mixed into an electroconductive material, for example, containing Ag and Pd at the ratio of Ag:Pd=7:3 to prepare an electroconductive paste, and the interior of the through holes is filled with the electroconductive paste, for example, by screen printing.

Subsequently, for example, using an electroconductive paste similar to the above, an internal electrode pattern is formed on one surface of each green sheet, for example, by screen printing. Subsequently, the predetermined number of green sheets with the internal electrode patterns printed thereon are stacked in the predetermined order to obtain a green laminate. Then the green laminate is pressed, for example, under the pressure of about 100 MPa with heat at about 60° C. to compressively bond the green sheets of the respective layers to each other. Thereafter, the green laminate is cut into a predetermined size.

Subsequently, the green laminate is mounted on a setter, and the green laminate is degreased (binder elimination), for example, at the temperature of about 400° C. for about ten hours. Thereafter, the setter with the green laminate thereon is placed in a hermetically closed sagger and the green laminate is fired, for example, at the temperature of about 1100° C. for about two hours to obtain the aforementioned multilayer body LA3 as a sintered body.

Subsequently, the individual terminal electrodes 50 and common terminal electrode 51, for example, of Ag are formed on the upper surface of the multilayer body LA3 after fired. Techniques of forming the terminal electrodes 50, 51 include printing, sputtering, electroless plating, and so on. Subsequently, the electroconductive film 52, for example, of Au is formed on the lower surface (displacement transfer surface) 46a of the multilayer body LA3. Techniques of forming the electroconductive film 52 include sputtering, printing, evaporation, electroless plating, and so on.

Subsequently, lead wires 70 are connected to the respective terminal electrodes 50, 51 by solder or the like. Then a polarization process is carried out, for example, by applying a predetermined voltage so as to achieve the field intensity of 3 kV/mm per thickness of the piezoelectric layer 47, in the environment of temperature of 120° C., for example, for three minutes. This completes the piezoelectric element PE3 as a piezoelectric ceramic actuator.

Thereafter, the liquid flow portion LF prepared separately is pasted to the bottom surface (displacement transfer surface) 46a of the piezoelectric element PE3 with an adhesive, thereby obtaining the piezoelectric device PD2.

In the piezoelectric device PD2 as described above, each liquid chamber 71 of the liquid flow portion LF is preliminarily filled with the liquid, and the liquid is in contact with the bottom surface 46a of the piezoelectric element PE3. When in that state a predetermined voltage is applied through lead wires 70 between any one individual terminal electrode 50 and the common terminal electrode 51 with the common terminal electrode 51 at the GND potential, the voltage is applied between the internal common electrode 49 and the internal individual electrodes 48 corresponding to the selected individual terminal electrode 50. This results in generating an electric field in a region between internal individual electrode 48 and internal common electrode 49 in each piezoelectric layer 47 (piezoelectric active part 47a ) and displacing this piezoelectric active part 47a in the stack direction of the multilayer body LA3. Then the displacement of the piezoelectric active part 47a is transferred through the displacement transfer layer 46 to the liquid in the corresponding liquid chamber 71. This decreases the volume of the liquid chamber 71 to eject the liquid in an amount corresponding to the decrease of the volume from the liquid outlet 73.

At this time, since the electroconductive film 52 provided on the bottom surface 46a of the piezoelectric element PE3 is electrically connected through the through hole 67 to the internal common electrode 49, the same GND potential as the potential of the internal common electrode 49 is applied to the electroconductive film 52. For this reason, the negative electric field is applied to the electroconductive film 52, and in conjunction therewith the negative electric field is also applied to the liquid in contact with the electroconductive film 52. This prevents the liquid in the liquid chamber 71 from being positively charged by static electricity or the like, which prevents the phenomenon in which the charged liquid is attracted toward the internal common electrode 49 by electro-osmosis to penetrate into the piezoelectric element PE3. Therefore, it suppresses a drop of insulation resistance of the piezoelectric element PE3 due to penetration of the liquid, which can suppress occurrence of characteristic deterioration of the piezoelectric element PE3. As a result, it becomes feasible to improve the reliability of the piezoelectric element PE3.

Figure 23:
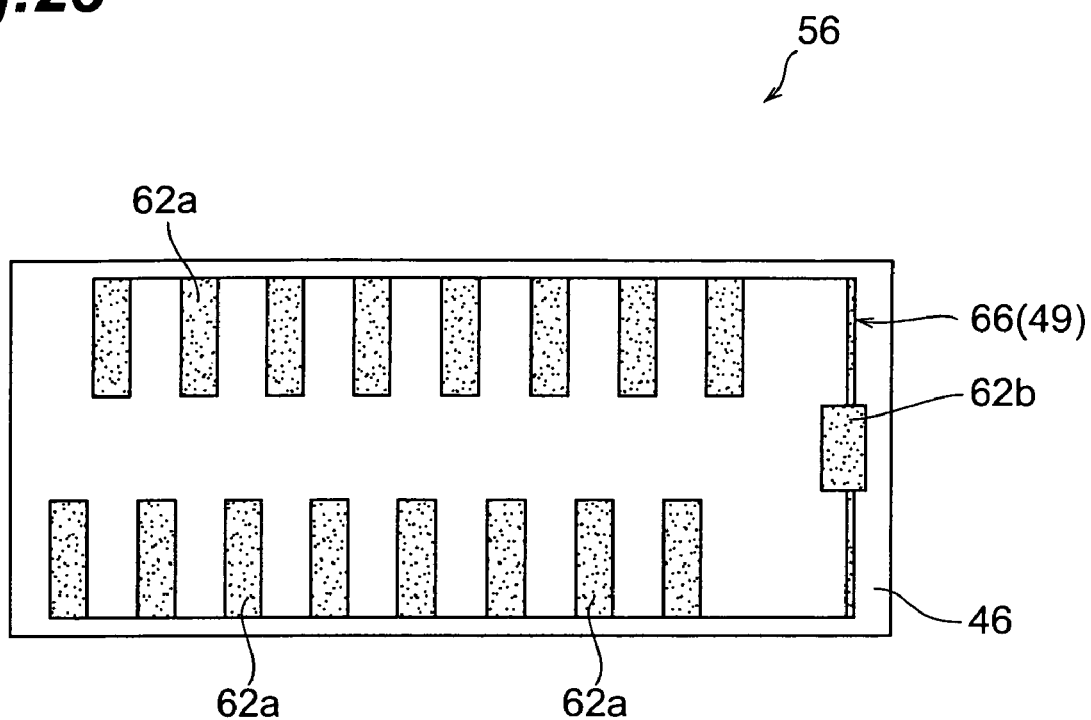
FIG. 23 is a plan view illustrating a modification example of the electrode-attached ceramic layer illustrated in FIG. 20.

Accordingly, there is no need for providing a partition in a predetermined thickness between the piezoelectric element PE3 and the liquid flow portion LF, in order to avoid the insulation failure or the like of the piezoelectric element PE3. For this reason, there occurs no inhibition to transfer of displacement of the piezoelectric layer 47 to the liquid due to the partition, and the number of layers in the multilayer body LA3 does not have to be increased more than necessary in order to compensate for the loss of the transferred displacement amount due to the partition. This enables size reduction of the piezoelectric element PE3 and, in turn, size reduction of the piezoelectric device PD2, and avoids increase of production cost thereof In the piezoelectric element PE3 of the third embodiment, the through hole 67 for electrically connecting the electroconductive film 52 to the internal common electrode 49 is provided in the displacement transfer layer 46, but the through hole 67 does not always have to be provided, as shown in FIG. 23. In this case, a lead wire or the like is attached to the electroconductive film 52, and the same voltage is applied to the internal common electrode 49 and to the electroconductive film 52.

In the third embodiment the electroconductive film 52 is formed substantially on the entire surface of the displacement transfer surface 46a of the displacement transfer layer 46, but the electroconductive film 52 may be formed at least in the region of the displacement transfer surface 46a corresponding to the liquid chambers 71 of the liquid flow portion LF.

The third embodiment adopted the structure in which a plurality of piezoelectric layers 47 were stacked, but a single layer suffices for the piezoelectric layer 47 if a particularly large displacement amount is not needed. The number, array configuration, etc. of internal individual electrodes 48 of each layer do not have to be limited, particularly, to those in the third embodiment. The internal electrode located at the lowermost position in the active region layer 45 is not limited to the internal common electrode 49 in the above embodiment, but the internal individual electrodes 48 may be located at the lowermost position.

In the third embodiment the displacement transfer layer 46 was made of the same ceramic material as the piezoelectric layer 47, but the displacement transfer layer 46 may be made of a ceramic material different from that of the piezoelectric layer 47, a resin, or the like.

Electric connection means between the internal individual electrodes 48 of the respective layers and between the internal common electrodes 49 of the respective layers are not limited to the through holes in the above embodiment, but they may be, for example, external electrodes formed on side faces of the multilayer body LA3.

It will be specifically described below with Example 2 and Comparative Example 2 that the third embodiment can suppress the insulation deterioration.

EXAMPLE 2

First, thirty piezoelectric elements PE3 of the third embodiment were prepared, and the liquid flow portion LF was pasted to each of these to form piezoelectric devices PD2. Then lead wires 30 were attached to each piezoelectric element PE3 to bring it into a state in which the voltage could be applied to the terminal electrodes 50, 51. Subsequently, a liquid was charged into the liquid flow portion LF of each piezoelectric device PD2 to be sealed. The liquid was one in which the principal component was pure water and in which glycerin and a nonionic surfactant were mixed. Subsequently, the dc voltage of 1 kV/mm per thickness of the piezoelectric layer 47 was simultaneously applied to all the individual terminal electrodes 50. Then static electricity was periodically applied to the piezoelectric devices PD2.

Then each piezoelectric device PD2 was continuously driven for 500 hours and states before and after the driving of the piezoelectric element PE3 were checked. Specifically, the liquid was discharged from the liquid flow portion LF after passage of 500 hours since the start of driving of the piezoelectric device PD2, and insulation resistance of piezoelectric element PE3 was checked. None of the piezoelectric elements PE3 demonstrated a drop of insulation resistance.

COMPARATIVE EXAMPLE 2

Thirty piezoelectric elements without the electroconductive film on the bottom surface (displacement transfer surface) were prepared as piezoelectric elements of Comparative Example 2, and piezoelectric devices were fabricated therefrom. Then the piezoelectric devices were continuously driven for 500 hours in the same manner as in Example 2 above. As a result, seventeen piezoelectric elements demonstrated the 2 to 3-digit drop of insulation resistance. It was determined from this result that the effect of the third embodiment was confirmed.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A piezoelectric element comprising:
   a multilayer body comprising an alternate stack of first internal electrodes and second internal electrodes with a piezoelectric layer in between each two of the first and second internal electrodes,
   wherein the multilayer body has an outermost piezoelectric layer adjoining the second internal electrode at an extreme end in a stack direction of the multilayer body among the first internal electrodes and the second internal electrodes and constituting one end face in the stack direction of the multilayer body,
   wherein the whole first internal electrode adjacent in the stack direction of the multilayer body to the second internal electrode adjoining the outermost piezoelectric layer is hidden by the second internal electrode adjoining the outermost piezoelectric layer, when viewed in the stack direction of the multilayer body from the outermost piezoelectric layer side,
   wherein an entire surface of the outermost piezoelectric layer adjoining the second internal electrode is covered by said second internal electrode,
   wherein peripheries of the second internal electrode adjoining the outermost piezoelectric layer are exposed at side surfaces of the multilayer body, and
   wherein peripheries of the first and second internal electrodes except the second internal electrode adjoining the outermost piezoelectric layer are located inside the side surfaces of the multilayer body and not exposed at the side surfaces of the multilayer body.

2. The piezoelectric element according to claim 1, wherein each first internal electrode is comprised of a plurality of individual electrodes arrayed in a matrix pattern.

3. A piezoelectric element comprising:
   a multilayer body comprising an alternate stack of first internal electrodes and second internal electrodes with a piezoelectric layer in between each two of the first and second internal electrodes,
   wherein the multilayer body has an outermost piezoelectric layer adjoining the second internal electrode at an extreme end in a stack direction of the multilayer body among the first internal electrodes and the second internal electrodes and constituting one end face in the stack direction of the multilayer body,
   wherein when an electric field is created between the first internal electrodes and the second internal electrodes, no charge opposite to that on the second internal electrode adjoining the outermost piezoelectric layer is generated on the one end face in the stack direction of the multilayer body, and
   wherein an entire surface of the outermost piezoelectric layer adjoining the second internal electrode is covered by said second internal electrode,
   wherein peripheries of the second internal electrode adjoining the outermost piezoelectric layer are exposed at side surfaces of the multilayer body, and
   wherein peripheries of the first and second internal electrodes except the second internal electrode adjoining the outermost piezoelectric layer are located inside the side surfaces of the multilayer body and not exposed at the side surfaces of the multilayer body.

* * * * *